United States Patent [19]

Aoyama et al.

[11] Patent Number: 5,194,743

[45] Date of Patent: Mar. 16, 1993

[54] DEVICE FOR POSITIONING CIRCULAR SEMICONDUCTOR WAFERS

[75] Inventors: Masaaki Aoyama, Yokohama; Naomasa Shiraishi, Urawa; Ken Hattori, Hara; Atsushi Yamaguchi, Fujisawa; Kesayoshi Amano, Tokyo, all of Japan

[73] Assignee: Nikon Corporation, Tokyo, Japan

[21] Appl. No.: 679,251

[22] Filed: Apr. 2, 1991

[30] Foreign Application Priority Data

Apr. 6, 1990 [JP] Japan ................................ 2-91448

[51] Int. Cl.⁵ ...................... G01N 21/86; G01B 11/00
[52] U.S. Cl. .................................. 250/548; 250/561; 356/400
[58] Field of Search ................ 250/548, 557, 561; 356/399, 400, 401

[56] References Cited

U.S. PATENT DOCUMENTS

| | | | |
|---|---|---|---|
| 4,752,898 | 6/1988 | Koenig | 356/400 |
| 4,853,880 | 8/1989 | Akamatsu et al. | 356/400 |
| 4,907,035 | 3/1990 | Galburt et al. | 356/400 |
| 4,955,780 | 9/1990 | Shimane et al. | 250/548 |
| 5,044,752 | 9/1991 | Thurfjell et al. | 250/548 |

*Primary Examiner*—David C. Nelms
*Assistant Examiner*—Michael Messinger

*Attorney, Agent, or Firm*—Shapiro and Shapiro

[57] ABSTRACT

A device for positioning a circular substrate having a cut portion, comprising: a first rotational stage which is finely rotated around the origin of a rectangular coordinate system; an X-Y stage on the first rotational stage which is two-dimensionally moved in the coordinate system; a second rotational stage on the X-Y stage which is rotated while holding the substrate; a first detecting device for detecting information about the displacement change of the periphery of the substrate from the rotational center during the rotation of the second rotational stage; a first positioning controlling device for controlling the rotation of the second rotational stage in accordance with information detected by the first detecting device so that the cut portion is placed in a predetermined direction on the coordinate system; a second detecting device having three or more detecting points in the coordinate system so as to detect the three or more positions of the periphery, the second detecting device generating information about a detection at each of the three or more detecting points; and a second positioning controlling device for controlling the X-Y stage and the first rotational stage in accordance with the detection information from the second detecting device after the cut portion has been placed in the predetermined direction.

16 Claims, 13 Drawing Sheets

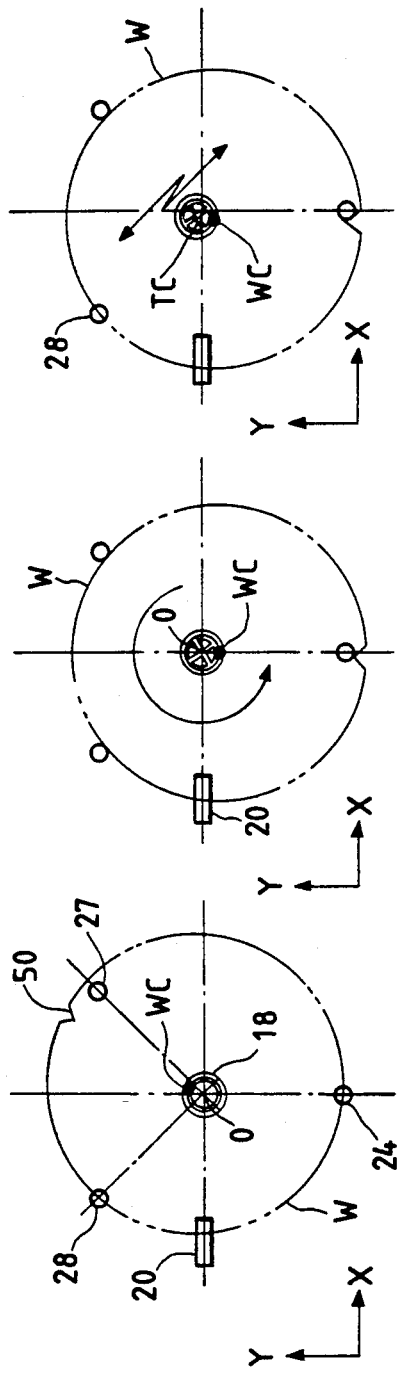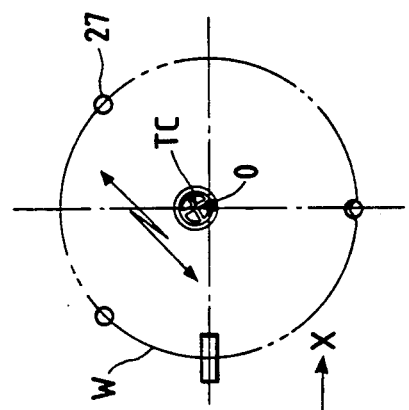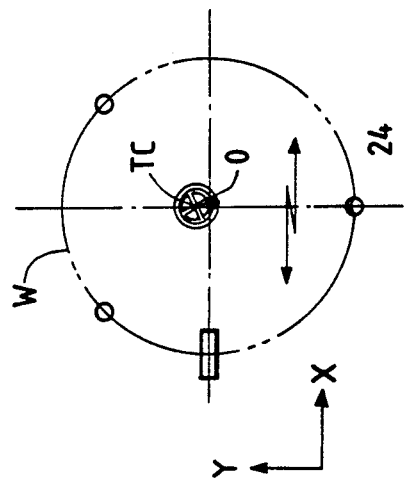
FIG. 9A FIG. 9B FIG. 9C FIG. 9D FIG. 9E

DEVICE FOR POSITIONING CIRCULAR SEMICONDUCTOR WAFERS

BACKGROUND OF THE INVENTION

1. Field of the Invention

The present invention relates to a device for positioning a semiconductor wafer which can be preferably used in, for example, a manufacturing device or an inspection device which is used in a process for manufacturing semiconductor devices, the semiconductor wafer having a cut portion (an orientation flat or a notch). More particularly, the present invention relates to a positioning device which can be preferably employed in an exposing device (a stepper, an aligner or the like) which must have an excellent positioning accuracy.

2. Related Background Art

Hitherto, exposing devices and inspection devices for use in a process for manufacturing semiconductor devices, and, more particularly, in a lithography process, employ an orientation flat (hereinafter called "OF") or notch so as to position the wafer with respect to the position of the device. In particular, the alignment accuracy of exposing devices must be improved since the semiconductor devices have been densely integrated and precisely manufactured. Therefore, a demand of accurately positioning and mounting the wafer on a device has arisen. A positioning device of the type described above is disposed in a passage of the exposing device through which the wafer is conveyed, the positioning device being arranged to act in accordance with a method in which the wafer is abutted against a reference member which is able to come in contact with the circumferential portion and the cut portion. Another method has also been employed in which the cut portion is optically detected by irradiating an optical beam to the periphery portion. In accordance with the former method, the wafer can be easily broken and the resist can be easily separated because the wafer is brought into contact with the reference member. Therefore, the manufacturing yield will be deteriorated since with the above-described broken or separated resist dust adheres, as foreign materials, to the surface of the wafer. Therefore, the latter method is widely used at present.

FIG. 16 is a schematic view which illustrates the structure of a conventional positioning device. FIG. 17 is a cross sectional view taken along line C—C of FIG. 16. As shown in FIGS. 16 and 17, an XY-stage 100 is supported on a base plate 106 via a guide member 107 in such a manner that the XY-stage 100 is able to move in X and Y directions. Furthermore, a $\Delta\theta$ stage 101 is disposed on the XY-stage 100 in such a manner that it is able to slightly rotate around origin 0 of the rectangular coordinate system XY. In addition, a stepping motor 105 is disposed on the lower surface of the $\Delta\theta$ stage 101 in such a manner that its motor shaft is made substantially to coincide with the origin O. Furthermore, a wafer chuck (turn table) 102 is secured to the motor shaft of the stepping motor 105 so that a $\theta$-stage capable of infinitely rotating while holding the wafer W is constituted. A vacuum attraction groove 102a is formed in the surface layer of the turn table 102. The pressure at a space surrounded by the groove 102a and the reverse side of the wafer W is reduced so that the wafer W is drawn to the surface of the turn table 102. An external shape measuring sensor 103 includes a halogen lamp 108 and a lens 109, the external shape measuring sensor 103 detecting the position of the wafer edge by projecting the contour of the wafer W onto a line image sensor 111 by irradiating the peripheral portion of the wafer with irradiating light from the reverse side via a mirror 110. Reference numeral 104 represents a wafer conveying belt which is moved downwards after the wafer edge has been moved to a position corresponding to the central portion of the external shape measuring sensor 103 so as to send the wafer W to the turn table 102.

In the thus constituted device, distance $\rho$ from the rotational center of the turn table 102 to the wafer edge is detected by the external shape measuring sensor 103 in accordance with each of the rotational angles while rotating the turn table 102. In accordance with data about the result of the above-described detection, the direction of the OF is detected before the rotational directional positioning (an OF alignment) is performed within a range of the established accuracy (determined in accordance with the resolution of the stepping motor 105) of the rotational angle of the turn table 102. Furthermore, the $\Delta\theta$ stage 101 is swung in accordance with the above-described data so that the direction of the OF is further precisely aligned. Then, the XY-stage 100 is operated so as to move the wafer center to the position (the origin O) at which the rotational center of the turn table 102 has been positioned before the correction is performed. The quantity of correction of the XY-stage 100 in the directions X and Y is calculated by measuring, at that time, the above-described distance $\rho$ for three or four points ($P_1$, $P_2$ and $P_3$ of FIG. 16) on the circumference except for the OF. As a result, the wafer W can be accurately positioned with respect to the rectangular coordinate system XY while preventing undesirable two-dimensional deviation (rotation included).

However, there arises a problem in that the resist layer formed on the surface of the wafer can be easily separated in the periphery portion and the separated resist will adhere to the surface of the wafer, causing the manufacturing yield to be deteriorated. In order to prevent the separation of the resist, a portion, having a predetermined width (about 1 to 7 mm), of the periphery is selectively exposed to light by rotating the wafer while applying exposing light emitted from an exclusive exposing device to the periphery of the wafer. Specifically, the structure comprises an illuminating portion (for example, an optical fiber) disposed closely to the periphery portion and arranged to emit the exposing light. The structure further comprises a light receiving portion disposed to confront the irradiating portion via the periphery portion and arranged to receive an exposing light beam which has not been stopped by the periphery portion. The illuminating portion and the light receiving portion are integrally constituted in such a manner that they are able to move in the radial direction of the wafer. When the periphery is exposed to light, the illuminating portion, the light receiving portion and the wafer are relatively moved in the radial direction in accordance with the change in the detection signal transmitted from the light receiving portion so that the portion, having the predetermined width, of the periphery is always exposed to light. Furthermore, a structure has recently been disclosed in which a periphery exposing device of the type described above is included in the above-described positioning device.

However, a problem arises in the thus constituted conventional structure in that the weight and load of the XY-stage 100 becomes excessively large because the Δθ stage is disposed on the XY-stage 100. As a result, the size of the XY-stage cannot be reduced, the operating speed will be lowered and the servo following performance or the like can be deteriorated. In a case where a heavy and large-size stage of the type described above is operated during the periphery exposure operation or the inspection operation, another problem arises in that the alignment accuracy and inspection accuracy can be deteriorated due to vibrations generated when the stage is moved.

When the wafer is held by the wafer chuck, it is impossible to accurately align the wafer center to the central portion of the wafer chuck. Therefore, when the wafer edge is detected by using the external shape measuring sensor, the wafer is eccentrically rotated. As a result, the light receiving surface of the line image sensor must have a sufficient length in the radial direction of the wafer. For example, in a case of a 6-inch wafer having an OF, the usual OF portion must have the light receiving portion the length of which is about 6 mm in the radial direction of the wafer. Furthermore, it is actually necessary for the length of the light receiving surface to be about 20 mm because the distance (quantity of the deviation) between the wafer center and the central portion of the chuck must be taken into consideration. Therefore, a problem arises in that accurate positioning cannot be performed since the resolution and the linearity of the conventional analog sensor are insufficient and the halogen lamp cannot emit uniform irradiating light beams. Furthermore, a problem arises in that the time taken to detect the subject is too long since the CCD has a sensor resolution of about several micrometers and there is an influence of the sweeping frequency at the time of the detection operation.

In order to improve the positioning accuracy in the above-described device, an accurate encoder and a stepping motor must be used to position the turn table after the rotation. Therefore, the overall cost of the device cannot be reduced and the weight of the same cannot also be reduced.

In order to expose the periphery of the wafer to light by using the above-described exclusive exposing device, servo operation means must be individually employed which integrally operates the illuminating portion and the light receiving portion for the purpose of always exposing the predetermined width of the periphery portion to light. Furthermore, the servo control condition becomes too strict because the weight of the illumination portion increases if an optical system for equalizing the light intensity distribution of the exposing light beam is further employed. The servo control condition also becomes too strict when another optical system for reducing the numerical aperture of the exposing light beam is used, the optical system for reducing the numerical aperture being provided for the purpose of preventing a so-called reduction of the thickness which is a problem taking place at the development process in that a portion of the resist is removed since the exposing light beam is introduced into a further inside portion (toward the central portion of the wafer) over a predetermined exposure width when the periphery is exposed to an exposing light beam having a large numerical aperture (N.A) emitted from, for example, an optical fiber. In addition, the servo controlling condition must be strictly determined for the OF portion in comparison to the conditions for the circumferential portion. As a result, another problem arises in that the exposure width cannot be equalized in the OF portion.

SUMMARY OF THE INVENTION

An object of the present invention is to provide a positioning device capable of accurately and quickly positioning a circular substrate while maintaining a satisfactory manufacturing yield and a throughput.

Another object of the present invention is to provide a positioning device capable of accurately and quickly positioning a circular substrate, having a periphery exposing function, and capable of controlling the exposure width in a cut portion with accuracy similar to that in the circumferential portion.

In order to achieve the above-described object, according to one aspect of the present invention, there is provided a device for positioning a circular substrate having a cut portion with respect to a rectangular coordinate system; comprising:

a first rotational stage capable of finely rotating substantially around the coordinate origin of the rectangular coordinate system;

an X-Y stage disposed on the first rotational stage and capable of two-dimensionally moving in the rectangular coordinate system;

a second rotational stage disposed on the X-Y stage and capable of rotating while holding the circular substrate;

a first detecting device for detecting information about a change in the quantity of displacement of the periphery of the circular substrate from the rotational center during the rotation of the second rotational stage;

first positioning controlling means for controlling the rotation of the second rotational stage in accordance with information detected by the first detecting device in such a manner that the cut portion of the circular substrate is placed in a predetermined direction on the rectangular coordinate system;

a second detecting device having at least three predetermined detecting points in the rectangular coordinate system so as to be capable of detecting at least three positions of the periphery of the circular substrate, the second detecting device generating information about a detection at each of the at least three detecting points; and second positioning controlling means for controlling the X-Y stage and the first rotational stage in accordance with the detection information supplied from the second detecting device after the cut portion has been placed in the predetermined direction by the first positioning controlling means.

In order to achieve the above-described object, the above-described positioning device further comprises:

exposing means including an illuminating portion for emitting an exposing light beam having characteristics which sensitize a resist layer of the circular substrate and a light receiving portion disposed to substantially confront the illuminating portion via the periphery of the circular substrate; and exposure controlling means for determining at least either of an exposing condition by means of the exposing light beam or the rotational speed of the circular substrate rotated by the second rotational stage in accordance with information about a proper quantity of exposure for the resist layer.

As described above, according to the present invention, the second rotational stage disposed on the X-Y stage is used only to perform the schematic cut portion alignment. Therefore, the necessity of using a high resolution encoder and a stepping motor can be eliminated, causing the overall weight and cost to be reduced. Furthermore, since the first rotational stage is disposed below the X-Y stage, the weight and the load of the X-Y stage can be reduced. Therefore, the positioning can be quickly and accurately performed. In addition, since the weight of the portion higher than the X-Y stage can be reduced, vibrations, which will be generated when the X-Y stage is moved at high speed, can be reduced. Consequently, undesirable influences, taking place at the time of the positioning operation and the periphery exposing operation can be eliminated.

Furthermore, since the second detecting device uses substantially parallel small spot light, the periphery can be accurately detected. If the length of a lever 7 shown in FIG. 1 is elongated so as to improve the positioning accuracy of the first rotational stage, specifically, to elongate the distance between the rotational center of the stage and the lever operating point, the positioning accuracy in the direction of rotation of, in particular, a circular substrate can be improved.

In addition, the structure is arranged in such a manner that the first rotational stage is constituted so as to be capable of rotating around the coordinate origin of the rectangular coordinate system. Furthermore, the positioning of the circular substrate in the direction of rotation is performed by swinging the first rotational stage after the above-described origin has been made substantially to coincide with the central portion of the circular substrate. Therefore, even if the positioning is performed in the rotational direction, the central portion of the circular substrate is not deviated from the origin. As a result, the necessity of again aligning the central portion of the circular substrate to the origin can be eliminated. Consequently, the deterioration in the throughput and the positioning accuracy can be prevented.

When the circular substrate is positioned in the direction X or Y and in the direction of rotation, the X-Y stage is servo-controlled in accordance with the output from the second detecting device (a spot sensor). Therefore, an advantage can be obtained in that the deterioration in the positioning accuracy in directions X and Y can be prevented even if the rotational center (the coordinate origin) of the first rotational stage is deviated from the actual center of the circular substrate when the rotational directional positioning is performed by swinging the first rotational stage.

Furthermore, the structure according to the present invention is arranged in such a manner that the exposing means for exposing the periphery to light is included in the positioning device and the exposing means (the exposing light beam) and the circular substrate are relatively moved in the radial direction of the circular substrate by using the stage mechanism of the positioning device as it is. Therefore, the necessity of providing an operating means can be eliminated and the exposing width can be accurately controlled even if the subject to be controlled is a cut portion. An optical system for equalizing the light intensity distribution can be easily disposed in the exposing means. Furthermore, when a linear cut portion is exposed to light, the X-Y stage can be one-dimensionally moved substantially along the cut portion by arranging the one-directional stroke of the X-Y stage to be elongated. Therefore, the exposure width can be controlled with accuracy similar to that obtainable at the circumferential portion. In addition, the exposure width can be controlled with accuracy similar to that at the servo control when the periphery is exposed to light while open-controlling the X-Y stage in accordance with various information items (the position of the central portion of the circular substrate, the length of the cut portion or the like) obtained at the positioning operation of the circular substrate. Furthermore, another advantage can be obtained in that the servo control mechanism can be omitted from the structure.

Other and further objects, features and advantages of the invention will be appear more fully from the following description.

BRIEF DESCRIPTION OF THE DRAWINGS

FIGS. 4A, 4B, 4C, 4D, and 4E are sequence diagrams which illustrate the operation of positioning a wafer having an OF;

FIGS. 9A, 9B, 9C, 9D, and 9E are sequence diagrams which illustrate the operation of positioning a wafer having a notch;

FIGS. 13A, 13B, 13C, 13D and 13E are sequence diagrams which illustrate the operation of exposing the periphery of the wafer having the OF;

DETAILED DESCRIPTION OF THE PREFERRED EMBODIMENTS

Figure 1:
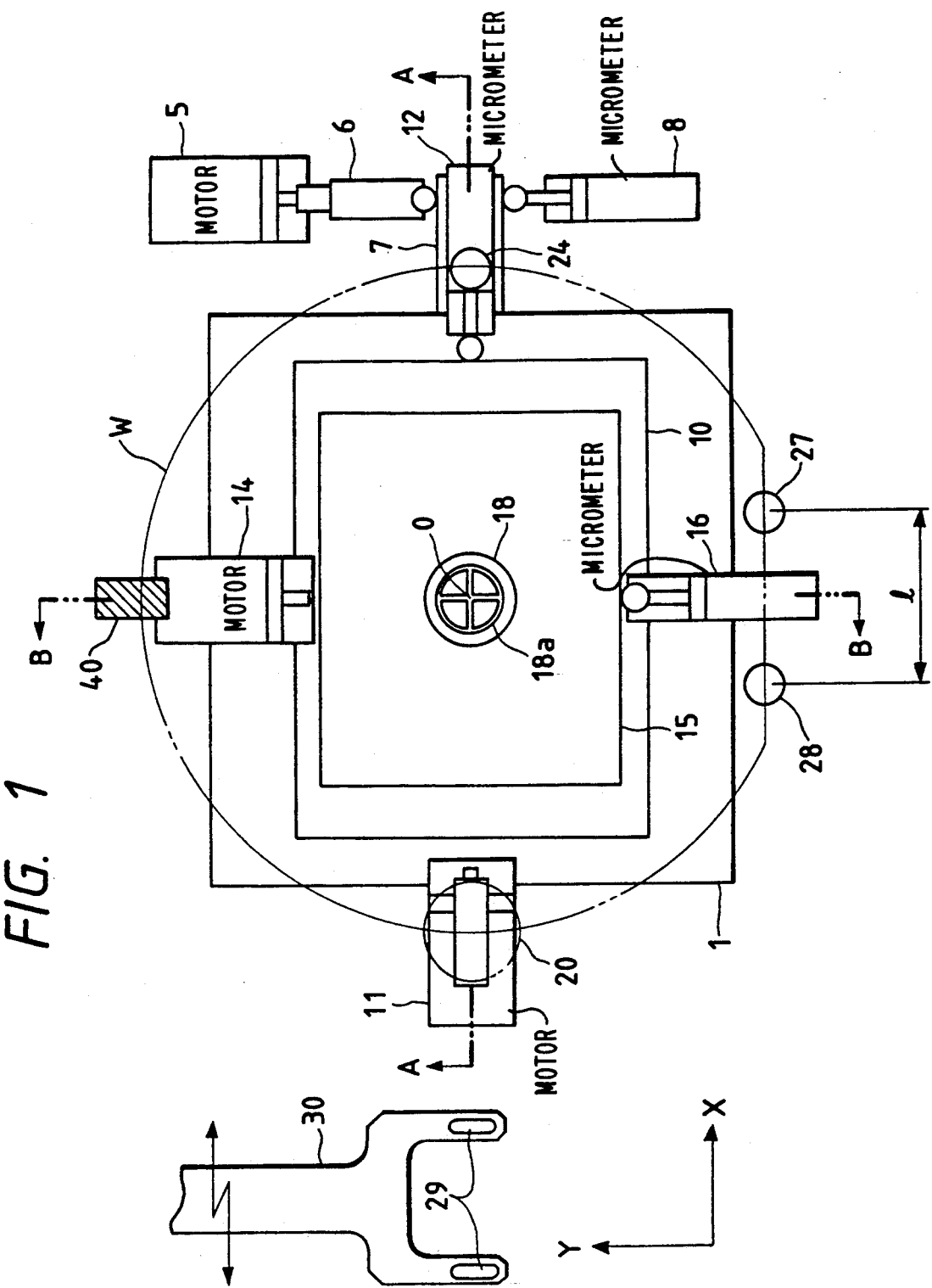
FIG. 1 is a plan view which illustrates the schematic structure of a first embodiment of a device for positioning a circular substrate according to the present invention.
Figure 2:
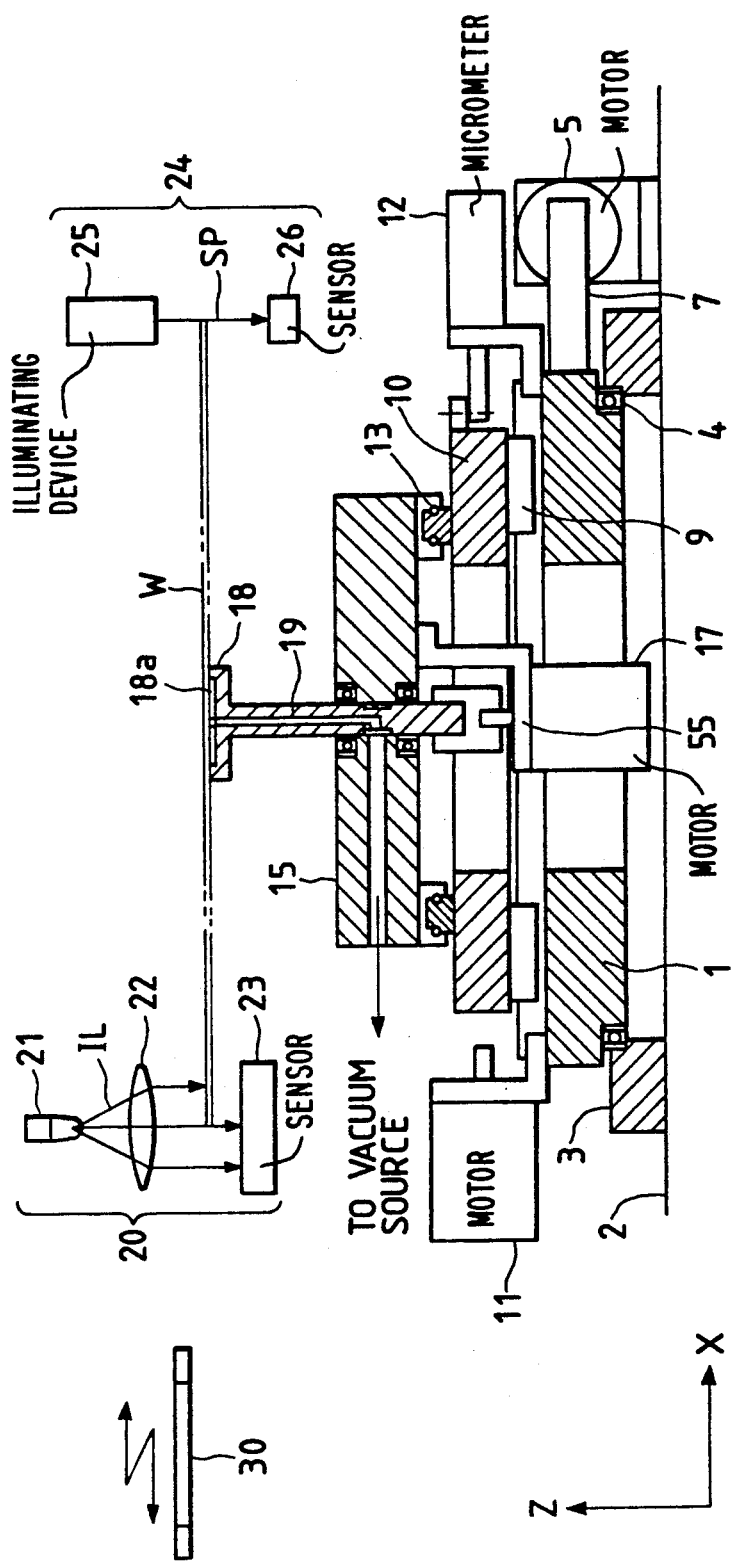
FIG. 2 is a cross sectional view taken along line A—A of FIG. 1.

FIG. 1 is a plan view which illustrates the schematic structure of a first embodiment of a positioning device according to the present invention. FIG. 2 is a cross sectional view taken along line A—A of FIG. 1. According to this embodiment, a positioning device capable of positioning a wafer having an OF (linear notch) will be described. The positioning device according to this embodiment is included in a stepper, and, more particularly, in a portion for conveying wafers. For simplicity, the wafer is finally positioned in such a manner that the wafer center aligns with origin O of a rectangular coordinate system XY defined as shown in FIG. 1, and the rotational error of the wafer with respect to the rectangular coordinate system is eliminated, that is, the direction of the OF (the direction of the edge) is made parallel to a predetermined direction (for example, direction X).

Referring to FIGS. 1 and 2, a $\Delta\theta$ stage 1 is supported on a base 2 via a base 3 and a guide bearing 4 in such a manner that its rotational center substantially aligns with the origin 0 of the rectangular coordinate system XY. Furthermore, the structure is arranged in such a manner that a linear motion is converted into a rotational motion when a lever 7 fixed to the $\Delta\theta$ stage 1 is operated by a $\Delta\theta$ motor 5 and a feeding screw 6. As a result, the $\Delta\theta$ stage 1 is able to finely rotate around the origin O in a range of ±2°. The quantity of a rotational angular degree of the $\Delta\theta$ stage 1 can be detected by measuring the distance of the movement of the feeding screw 6 with a resolution of, for example, about 0.5 $\mu$m, the quantity being measured by a digital micrometer 8 which is positioned to confront the $\Delta\theta$ motor 5 and the feeding screw 6 via the lever 7 in such a manner that it is positioned in contact with the side surface of the lever 7.

An X-stage 10 capable of moving along a guide member 9 extending in direction X is placed on the $\Delta\theta$ stage 1. Furthermore, a Y-stage 15 capable of moving along a guide member 13 extending in direction Y is placed on the X-stage 10. The X-stage 10 and the Y-stage 15 are operated by a stepping motor (X-motor) 11 and a stepping motor (Y-motor) 14. The positions of the two stages 10 and 15 are detected by digital micrometers 12 and 16 with a resolution of, for example, about 0.5 $\mu$m. A $\theta$-stage (a turn table) 18 is disposed on the Y-stage 15, the $\theta$-stage 18 being capable of holding and infinitely rotating wafer W. The turn table 18 is rotated at a predetermined speed by a $\theta$-motor 17 secured to a position below the X-stage 10 via a motor holder 55.

Although omitted from the illustration in FIGS. 1 and 2, the $\theta$-motor 17 comprises a means (an encoder 31, FIG. 3) for detecting the quantity of rotation of the turn table 18. The turn table 18 has, in the surface layer thereof, recessed portions radially extended from the center portion of the turn table 18 and an annular recessed portion (a vacuum attraction groove) 18a. A sleeve-like hole 19 connected to a hole (omitted from illustration) formed in the bottom of the groove 18a is connected to a vacuum source so as to reduce the pressure of the groove 18a. As a result, the wafer W can be drawn to the turn table 18 by making the pressure of a space defined by the reverse side of the wafer W and the groove 18a to be a negative level.

A carrying arm (fork) 30 holds the wafer W in such a manner that it draws the reverse side of the wafer W to a vacuum attraction surface 29 formed in the front portion of the fork 30, the fork 30 being able to move in lateral direction (direction X) by a guide mechanism (omitted from illustration) when viewed in the drawing. Therefore, the wafer W accommodated in a loader cassette (wafer carrier) is conveyed by the fork 30 to a position above the turn table 18. Then, the fork 30 and the turn table 18 are relatively moved in direction Z (the conveying arm 30 is moved downwards or the turn table 18 is moved upwards), causing the wafer W to be received by the turn table 18 so as to be held as described above.

An assumption is made that the wafer W is received by the turn table 18 while restricting the quantity of deviation of the wafer center from the rotational center (the origin O) of the $\Delta\theta$ stage 1 to be, for example, within ±5 mm. If the rotational center (designated by symbol Tc to be described later) of the turn table 18 is deviated from the rotational center (the origin O) of the $\Delta\theta$ stage 1, the above-described quantity of the deviation will be larger than ±5 mm. Although, the positioning operation may be started in the above-described state, there arises a necessity of elongating the stroke of movements of X and Y-stages 10 and 15 while estimating the maximum deviation. Accordingly, this embodiment is arranged in such a manner that the rotational center (the origin O) of the $\Delta\theta$ stage 1 and the rotational center of the turn table 18 are made to coincide with each other when the X and Y-stages 10 and 15 are at a predetermined neutral position, for example, at an intermediate position of the moving stroke. Furthermore, the wafer W is received at the above-described neutral position.

According to this embodiment, the X and Y-coordinates of the X and Y-stages 10 and 15 at the neutral positions are made to be zero, the values detected by digital micrometers 12 and 16 at this time being read and stored.

An analog sensor 20, at fixed points, detects the positional change of the wafer edge from the rotational center Tc of the turn table 18 due to the rotation of the wafer W, the analog sensor 20 being used in a schematic OF alignment. Referring to FIG. 1, the analog sensor 20 is disposed on axis X in such a manner that its slit-shaped light receiving surface (omitted from illustration) confronts the origin O (extends in the radial direction of the wafer W). However, it may be disposed at any position on the circumference around the origin 0 (the rotational center of the $\Delta\theta$ stage 1) which corresponds to the size of the wafer W. As shown in FIG. 2, the analog sensor 20 comprises a light source for emitting illuminating light IL, to the wavelength of which a resist layer is not sensitive, a lens 22 for making the irradiating light IL to be a parallel beam and a photoelectric sensor 23 (a position sensor, a CCD linear sensor or the like) disposed to confront the light source 21 via the periphery of the wafer W.

Figure 3:
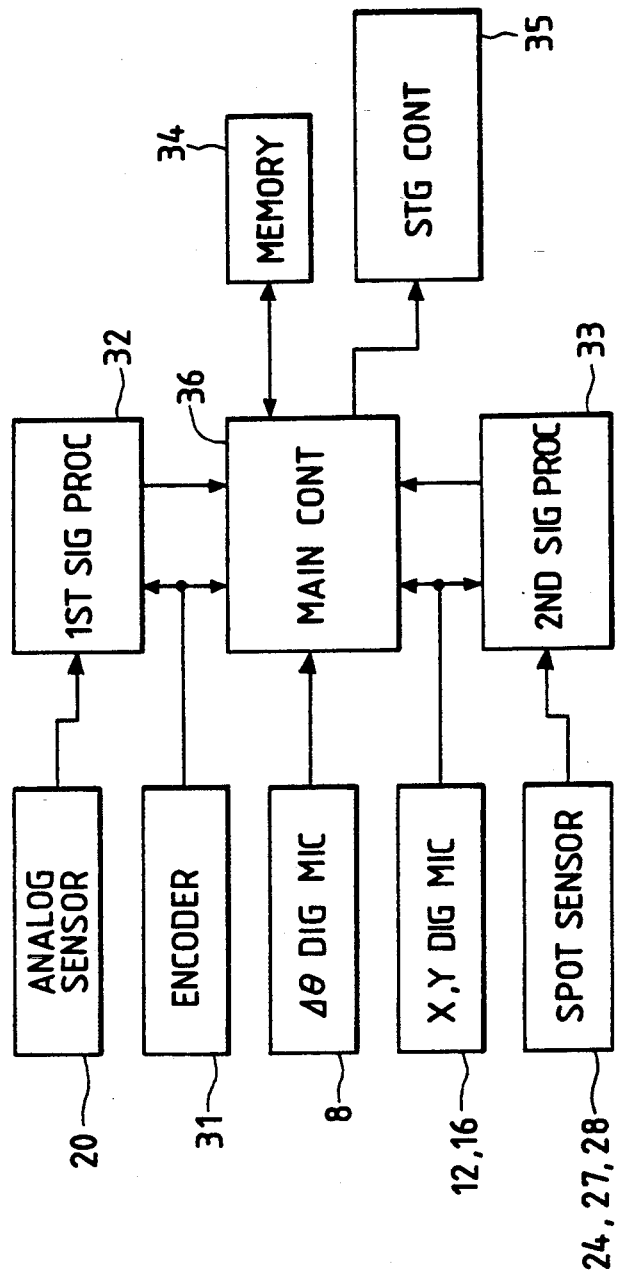
FIG. 3 is a block diagram which illustrates a control system according to the first embodiment of the present invention.

As shown in FIG. 3, the analog sensor 20 (the photoelectric sensor 23) transmits a photoelectric signal which corresponds to the intensity of the received illuminating light IL to a first signal processing system 32. Furthermore, information about rotation supplied from an encoder 31 is supplied to the first signal processing system 32. As a result, the positional change of the wafer edge is detected at a unit rotational angle (for example, 0.5°) of the turn table 18. The first signal processing system includes an A/D converter and a memory, the A/D converter digital-sampling the waveform of signals transmitted from the analog sensor 20 in response to up/down pulses transmitted from the encoder 31.

Spot sensors 24, 27 and 28 are provided for the purpose of detecting the position of the wafer edge by moving the X and Y-stages 10 and 15 so as to detect locational errors ($\Delta X$, $\Delta Y$ and $\Delta \alpha$) to be described later. Referring to FIG. 1, the spot sensor 24 is disposed on axis-X substantially symmetrically to the analog sensor 20 with respect to the origin 0. The spot sensors 27 and 28 are disposed substantially symmetrically to each other with respect to axis-Y and are aligned in direction X. The above-described sensors 24, 27 and 28 are, of course, arranged to correspond to the size of the wafer to be positioned. The spot sensor 24 comprises an illuminating device 25 for generating parallel beam SP (non-exposure wavelength) which forms a small spot (for example, a diameter of about 50 mm) on the surface of the wafer W. The spot sensor 24 further comprises a photoelectric sensor 26 disposed to confront the illuminating device 25 via the periphery of the wafer W.

Referring to FIG. 3, a second signal processing system 33 includes an A/D converter, a memory and the like, the second signal processing system receiving a photoelectric signal supplied from the spot sensor (the photoelectric sensor 26) and position information supplied from the digital micrometer 12 so as to detect the position at which the wafer edge traverses the small spot light SP. The second signal system 33 may be arranged to detect the position of the wafer edge in accordance with whether or not the photoelectric signal from the spot sensor 24 is present. However, correctly, the beam diameter of the small spot light cannot be neglected. The photoelectric signal is sampled at a unit distance for example, 0.5 $\mu$m) of movement of the X-stage 10 so as to be converted into a digital value so that the edge position is detected by predetermined calculations. Since the spot sensors 27 and 28 are arranged to have the same structure and function, descriptions about them are omitted here.

The spot sensor 24 may be disposed at any position on the circumferential portion (except for the intersection with a perpendicular bisector of the spot sensors 27 and 28). The spot sensors 27 and 28 must be disposed in the OF aligning direction in such a manner that distance 1 between them is shorter than the length of the OF. The spot sensors 27 and 28 may be disposed while being inclined from the OF aligning direction by, for example, a small angle which corresponds to the movable range (the quantity of rotation) of the $\Delta \theta$ stage 1. In this case, the OF is caused to approach the spot sensors 27 and 28 before the $\Delta \theta$ stage 1 is rotated by the above-described angle of inclination so that precise OF alignment (to be described later) can be completed.

Referring to FIG. 3, a main control system 36 calculates the positioning errors ($\Delta X$, $\Delta Y$ and $\Delta \alpha$) of the wafer W in response to a detection signal transmitted from the second signal processing system. Then, the main control system 36 issues a predetermined control command to the stage controller 35. As a result, the stage controller 35 operates the X-motor 11, Y-motor 14 and the $\Delta \theta$ motor 5 so that positioning of the wafer W is performed. Furthermore, the main control system 36 issues a command which corresponds to the quantity of the operation of the $\theta$ motor 17 at the time of the schematic OF alignment, the command being issued in response to a detection signal transmitted from the first signal processing system 32.

Figures 4A, 4B, 4C, 4D, 4E:
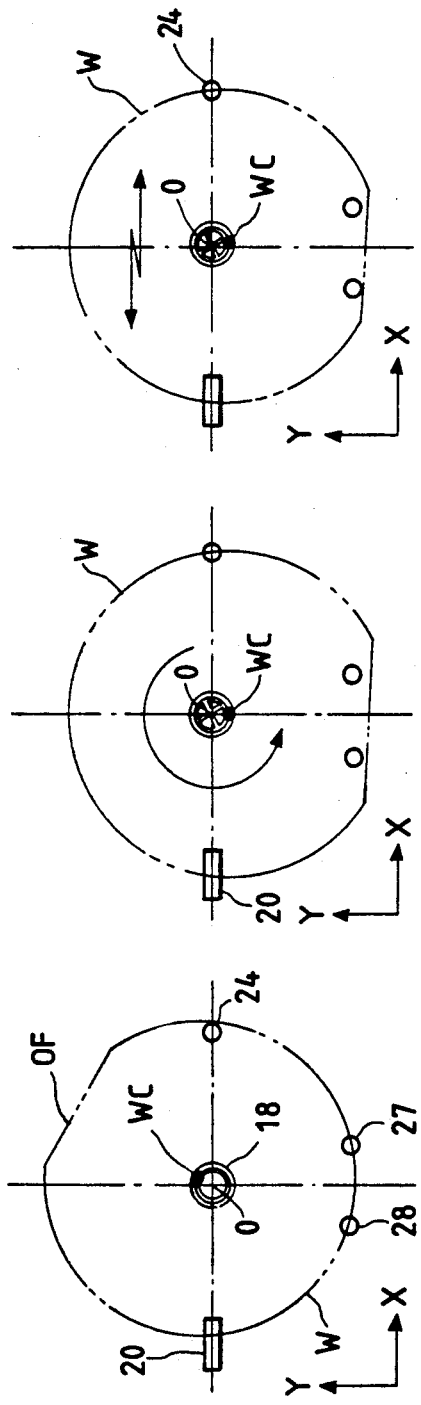

A positioning operation performed by the thus constituted structure will now be described with reference to FIG. 4. FIG. 4 illustrates a sequence of positioning the wafer having the OF. First, the wafer W is received by the turn table 18 while restricting the deviation of the wafer center Wc from the rotational center (the origin O) of the $\Delta \theta$ stage 1 to be within $\pm 5$ mm (see FIG. 4A). The main control system 36 causes the analog sensor 20 to detect illuminating light IL which has not been shielded by the wafer W while causing the turn table 18 to be rotated.

Figure 5:
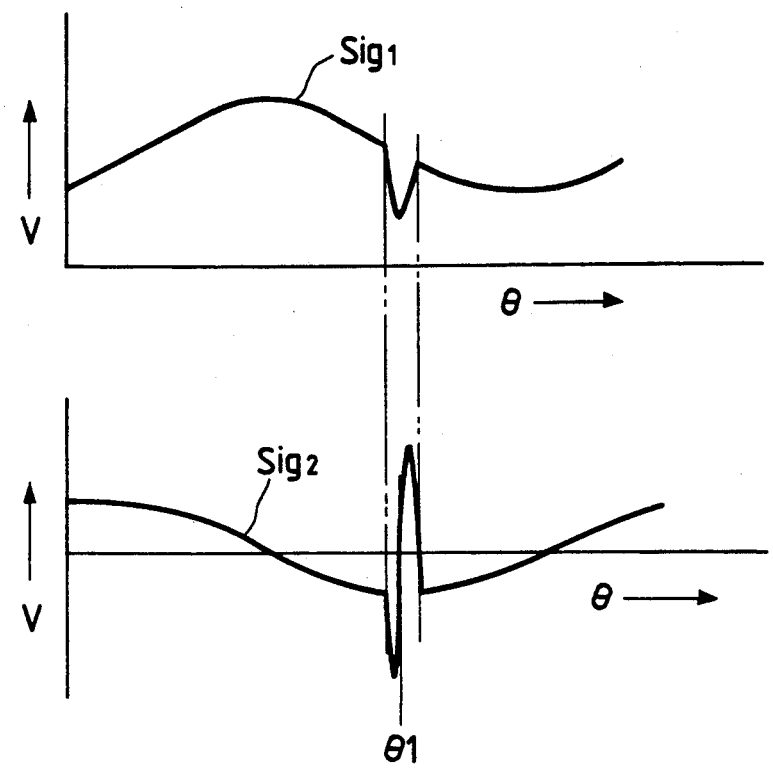
FIG. 5 illustrates the operation of a schematic OF alignment.

The first signal processing system 32 samples the photoelectric signal transmitted from the analog sensor 20 in response to the up/down pulse emitted from the encoder 31 so as to cause the results of the sampling to be converted into digital values which are to be stored in the memory (omitted from illustration) in the order of the addresses. As a result, signal waveform data $Sig_1$ which corresponds to the profile of the wafer edge as shown in FIG. 5 is obtained in the memory of the first signal processing system 32. The waveform data $Sig_1$ denotes the relationship between the level (voltage) of the photoelectric signal and the rotational angle $\theta$, that is, the positional change from the rotational center Tc of the wafer edge due to the above-described rotation.

Furthermore, the first signal processing system 32 converts the waveform data $Sig_1$ into waveform data $Sig_2$ as shown in FIG. 5 by differentiation operation in a software manner. Referring to the waveform data $Sig_2$, zero cross point (result of the differentiation) $\theta_1$ denotes the rotational angle which corresponds to the central portion of the OF. Therefore, the first signal processing system 32 calculates the rotational angular degree $\theta_1$ of the zero cross point present between the maximum value (peak value) and the minimum value (bottom value) of the waveform from the waveform data $Sig_2$ stored in the memory of the first signal processing system 32.

Then, while monitoring the output from the encoder, the main control system 36 counterclockwise rotates the turn table 18, as viewed in the drawing, so as to obtain the above-described rotational angle $\theta_1$. As a result, the OF is caused to approach the spot sensors 27 and 28. Consequently, the rotational deviation (inclination) of the OF from a segment (X-directional segment) connecting the two spot sensors 27 and 28 can be restricted within a predetermined allowable limit (for example, about $\pm 1°$). Thus, the alignment (the schematic OF alignment) of the OF to the spot sensors 27 and 28 is completed (see FIG. 4B).

According to this embodiment, since the turn table 18 is used only to perform the schematic OF alignment, an accurate $\theta$-motor and encoder can be eliminated from the structure. As a result, the weight of the portion above the Y-stage 15 can be reduced. For example, the resolution of the encoder 31 and the stopping accuracy of the $\theta$-motor 17 may be respectively arranged to be 0.5° and $\pm 1°$ and a light weight encoder and a motor which meet these conditions may be employed. In a case where a stepping motor is employed as the $\theta$-motor 17, the waveform data $Sig_1$ shown in FIG. 5 can be obtained by arranging the structure in such a manner that a counter for counting the number of the operating pulses to be supplied to the stepping motor and a memory for receiving, as the value of the address, the result of the counting performed by the counter are provided and by digital sampling, via an A/D converter, the photoelectric signal transmitted by the analog sensor 20. In this case, the encoder can be omitted from the structure and the overall weight can further be reduced.

Figure 6A:
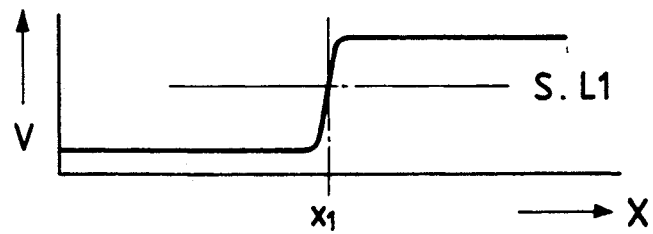
FIGS. 6A, 6B, and 6C respectively illustrate the waveforms of photoelectric signals obtainable from spot sensors.

After the above-described schematic OF alignment has been completed, the main control system 36 slightly moves the X-stage 10 so that the X-directional position of the wafer edge is detected by the spot sensor 24, When the X-stage 10 is slightly moved in this state, a photoelectric signal as shown in FIG. 6A is transmitted from the spot sensor 24. FIG. 6A illustrates the relationship between signal levels (voltage) V and the X-directional scanning position. The second signal processing system 33 process the waveform of that photoelectric signal with predetermined slice level $SL_1$ so as to calculate the position (coordinate $X_1$) of the wafer edge. The main control system 36 sets the wafer W to the above-described coordinate value $X_1$ by using an X digital micrometer 12. That is, the wafer edge is caused to be in a range of the spot sensor 24, causing the X-directional positioning of the wafer W to be completed (FIG. 4C).

Figure 6B:
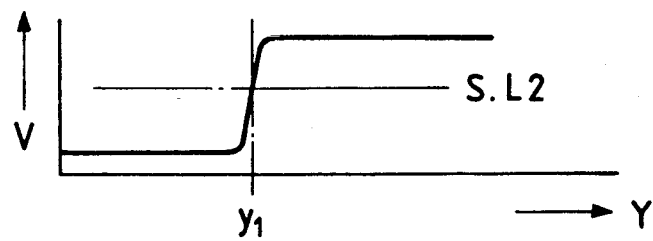
Figure 6C:
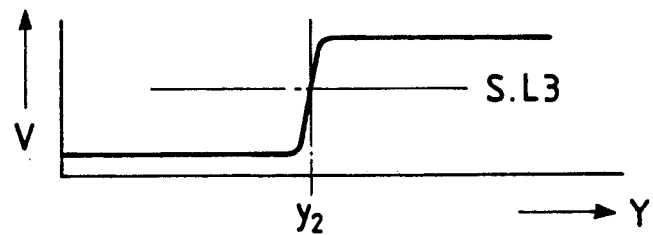

Then, the main control system 36 detects the Y-directional position of the wafer edge by using the spot sensors 27 and 28. FIGS. 6B and 6C respectively illustrate the photoelectric signals transmitted from the spot sensors 27 and 28. The second signal processing system 33 processes the waveform of the above-described photoelectric signals with slice levels $SL_2$ and $SL_3$ so that the edge position (coordinates $Y_1$ and $Y_2$) of the OF is detected. Then, the main control system 36 causes the OF to be moved within the range of the spot sensors 27 and 28 by using the Y-digital micrometer 16, that is, stops the Y-motor 14 at the time when the Y-digital micrometer detects the coordinate value $(Y1+Y2)/2$. As a result, the Y-directional positioning of the wafer W is completed (FIG. 4D). Furthermore, the rotational center (the origin O) of the $\Delta\theta$ stage 1 and the wafer center Wc substantially coincide with each other due to the above-described processes.

The main control system 36 performs the precise OF alignment in such a manner that the inclination of the OF with respect to the spot sensors 27 and 28 is calculated from the coordinate values $Y_1$ and $Y_2$, that is, residual rotational error $\Delta\alpha$ of the wafer W with respect to the rectangular coordinate system XY is calculated. Furthermore, the main control system swings the $\Delta\theta$ stage 1 while monitoring the result of the measurement performed by the digital micrometer 8 so as to correct the residual rotational error $\Delta\alpha$ to be substantially zero. Since the distance 1 between the spot sensors 27 and 28 is a known value (designed value), the residual rotational error $\Delta\alpha$ can be obtained from a calculation $\Delta\alpha=(Y_1-Y_2)/1$. As a result, the precise OF alignment of the wafer W is completed (FIG. 4E), and the above-described positional deviation quantities $\Delta X$, $\Delta Y$ and the rotational error $\Delta\alpha$ are made to be substantially zero. Thus, the positioning of the wafer W is completed. When the precise OF alignment (that is, the calculation of the residual rotational error $\Delta\alpha$) is performed, the edge position of the OF may be again detected by slightly moving the Y-stage 15 as an alternative to using the above-described coordinate values $Y_1$ and $Y_2$.

As described above, according to this embodiment, the wafer can be accurately positioned and the X and Y directional deviation of the wafer W can be prevented at the time of the precise OF alignment (the rotation to correct the residual rotational error $\Delta\alpha$) because the rotational center of the $\Delta\theta$ stage 1 and the wafer center Wc are made substantially to coincide with each other prior to the precise OF alignment.

According to the above-described embodiment, the wafer edge is caused to be positioned within the range of the X-directional positioning spot sensor 24 before the Y-directional positioning is performed by the spot sensors 27 and 28. However, the above-described sequential order may, of course, be inverted. However, if the X-directional positioning is performed prior to detecting the edge position (the coordinates $Y_1$ and $Y_2$) of the OF, an effect can be obtained in that the detecting accuracy of the residual rotational error $\Delta\alpha$ can be improved because the distance 1 between the Y-directional and rotational directional positioning spot sensors 27 and 28 can be previously enlarged. Furthermore, according to the above-described embodiment, the photoelectric signal transmitted from a spot sensor is digital-sampled for each unit distance of movement of the X and Y-stages. Then, the waveform of the photoelectric signal is processed with a predetermined level so that the position of the wafer edge is obtained. However, another structure may be employed in which the position of the wafer edge is obtained by latching the output value from the digital micrometer (the counter) when the level of the photoelectric signal has reached a predetermined voltage level (the voltage level which corresponds to the slice level shown in FIG. 6).

As described above, the quantity of the deviation of the wafer center from the rotational center (the origin O) of the $\Delta\alpha$ stage 1 is restricted to be within $\pm 5$ mm and the wafer W is drawn to the surface of the turn table 18. Therefore, when the Y-directional positioning operation is performed as shown in FIG. 4D, the wafer edge can be deviated from the spot senor. However, since there are the outer shape tolerance (about $\pm 0.5$ mm in diameter) and the dimension tolerance (about 2.5 mm) of the OF, the rotational center (the origin O) of the $\Delta\theta$ stage 1 simply coincides with the designed wafer center prior to the precise OF alignment. Therefore, the actual wafer center and the origin 0 do not accurately coincide with each other, causing the position of the wafer W to be deviated in directions X and Y at the time of the precise OF alignment. That is, the wafer edge can be deviated from the spot sensors 24, 27 and 28. Accordingly, it is preferable that the operation be performed in such a manner that the position of the wafer edge is detected by again slightly moving the X and Y-stages 10 and 15 so as to cause the wafer edge to be moved toward the spot sensors 24, 27 and 28.

In the case where the wafer edge is again moved to the range of the spot sensors after the precise OF alignment has been performed, a long time is required to position one wafer piece. Accordingly, when the X-directional positioning (see FIG. 4C) is completed in the above-described embodiment, the main control system 36 commences a servo control of the X-stage 10 in response to the photoelectric signal transmitted from the spot sensor 24. That is, the main control system 36 causes a stage controller 35 to slightly move the X-stage 10 in order to make the level of the photoelectric signal transmitted from the spot sensor 24 to be the same level as, for example, the slice level $SL_1$ (see FIG. 6A) which is used when the wafer edge position (the coordinate value X1) is calculated. As a result, the deviation of the wafer edge from the spot sensor 24, that is, the deterioration in the X-directional positioning accuracy, can be prevented even if the Y-directional positioning (see FIG. 4D) is performed. Another structure may be employed in which the main control system 36 previously obtains the level (the voltage level) of the photoelectric signal which is transmitted when the illuminating flux SP, emitted from the illuminating device 25 of the spot sensor 24, is made incident upon the photoelectric sensor 26 since it is not shielded by the wafer edge. Furthermore, a value which is half of the above-described voltage level is set to a reference value so as to operate the X-stage 10 in accordance with the level of the photoelectric signal transmitted from the spot sensor 24.

The wafer W may be deviated in the direction Y due to the above-described reason even if the precise OF alignment is performed while servo controlling the X-stage 10. Therefore, the wafer edge can be deviated from the spot sensors 27 and 28. Accordingly, the main control system 36 performs the Y-directional positioning operation (see FIG. 4D) in such a manner that it slightly moves the Y-stage 15 so as to obtain the position of the wafer edge (the coordinate values $Y_1$ and $Y_2$). Then, the wafer edge (OF) is moved to the range of the spot sensor 27 (or 28) in accordance with the result of the above-described detection. When the Y-direction movement of the wafer edge has been completed, the servo control of the Y-stage 15 is commenced in response to the photoelectric signal transmitted from the spot sensor 27 similarly to the above-described operation. That is, the main control system 36 causes a stage controller 35 to slightly move the X-stage 15 in order to make the level of the photoelectric signal transmitted from the spot sensor 27 to be the same level as the slice level $SL_2$ see FIG. 6B) which is used when the wafer edge position (the coordinate value $Y_1$) is calculated. As a result, the deviation of the wafer edge from the spot sensor 27, that is, the deterioration in the Y-directional positioning accuracy, can be prevented even if the precise OF alignment (see FIG. 4E) is performed.

Figure 7:
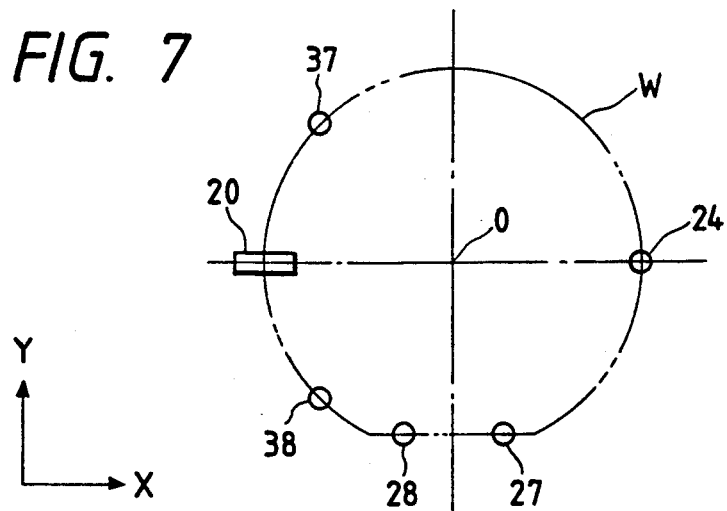
FIG. 7 illustrates the configuration of spot sensors for measuring the diameter.

In a case where a positioning error exceeding a predetermined allowable limit (usually, it is about ±15 μm) can be present because the wafer center does not accurately coincide with the origin O due to the manufacturing tolerance for the wafer, spot sensors 37 and 38 (constituted similarly to the spot sensor 24) for measuring the diameter are, as shown in FIG. 7 disposed substantially symmetrically with respect to X-axis which passes through the origin O. Furthermore, after the positioning operation according to the above-described embodiment has been completed, the Y-stage 15 is slightly moved so as to detect the position of the wafer edge by the spot sensors 24, 37 and 38. Then, the actual diameter of the wafer is obtained from the three coordinate values so as to again slightly move the X and Y-stages 10 and 15 in accordance with the obtained diameter. As a result, the origin O and the actual wafer center can be made accurately to coincide with each other. Therefore, the deterioration in the positioning accuracy due to the above-described tolerance can be prevented.

When the wafer W is Y-directionally positioned (see FIG. 4D) in the manner according to the above-described embodiment, it is preferable to also detect the position of the wafer edge by the spot sensors 24, 37 and 38. In this case, the actual wafer center and the origin O can be made accurately to coincide with each other prior to the precise OF alignment. Furthermore, the necessity of again finely moving the Y-stage for measuring the diameter can be eliminated.

In this state, the distance 1 between the spot sensors 27 and 28 may be determined in accordance with the accuracy in the schematic OF alignment, that is, the stopping accuracy of the θ-motor 17 and the detecting resolution of the encoder 31 and that of the analog sensor 20. The movement stroke of each of the X and Y-stages 10 and 15 may be determined in accordance with the quantity of total deviation (±5 mm) and the accuracy of the schematic OF alignment, the total deviation being determined by the positional deviation of the wafer W, which has been taken from the wafer carrier, on the turn table 18 and the accuracy (usually, it is about ±5 μm) at the time of sending/receiving the wafer W between the fork 30 and the turn table 18. Furthermore, the range of the movement of the Δθ stage 1 (that is, the movement stroke of the feeding screw 6) may also be determined in accordance with the accuracy of the schematic OF alignment. According to this embodiment, it may be set to about ±1.5 to 2°. If the schematic OF alignment accuracy is set to a high level, the range of the movement of the Δθ stage 1 can relatively be reduced and the distance I between the spot sensors 27 and 28 can be elongated. However, the portion above the Y-stage 15 becomes larger and heavier. Therefore, it is preferable that the range of the movement of the Δθ stage 1 be determined in consideration of the balance between above-described two factors. The accuracy of the schematic OF alignment is not limited to ±1° if the determined angle enables the OF to simultaneously traverse the small spot light beams emitted from the spot sensors 27 and 28 when the Y-stage 15 is slightly moved after the schematic OF alignment has been completed.

According to the above-described first embodiment, the X and Y directional positioning and the precise OF alignment (see FIGS. 4C to 4E) are performed by detecting (see FIG. 6) the position of the wafer edge by the spot sensors 24, 27 and 28 by slightly moving the X and Y-stages 10 and 15. However, another structure may be employed in which the position of the wafer edge is not accurately obtained but the X-stage 10, the Y-stage 15 and the Δθ stage 1 are slightly moved in such a manner that each of the signal levels becomes predetermined voltage level (which corresponds to the slice levels $SL_1$ to $SL_3$ shown in FIG. 6), while monitoring the photoelectric signal transmitted from the spot sensors 24, 27 and 28. Thus, the wafer edge is moved to the ranges of the spot sensors 24, 27 and 28. In this case, the necessity of using a position sensor for the Y, Y and Δθ stages can be eliminated. Therefore, an effect can be obtained in that the weight of the device can be reduced. As a result of the above-described structure, a precise position sensor (a digital micrometer, an interferometer or the like) can be omitted from the structure. However, it is preferable that a position sensor (excellent detecting accuracy is not required) be provided.

Figure 8:
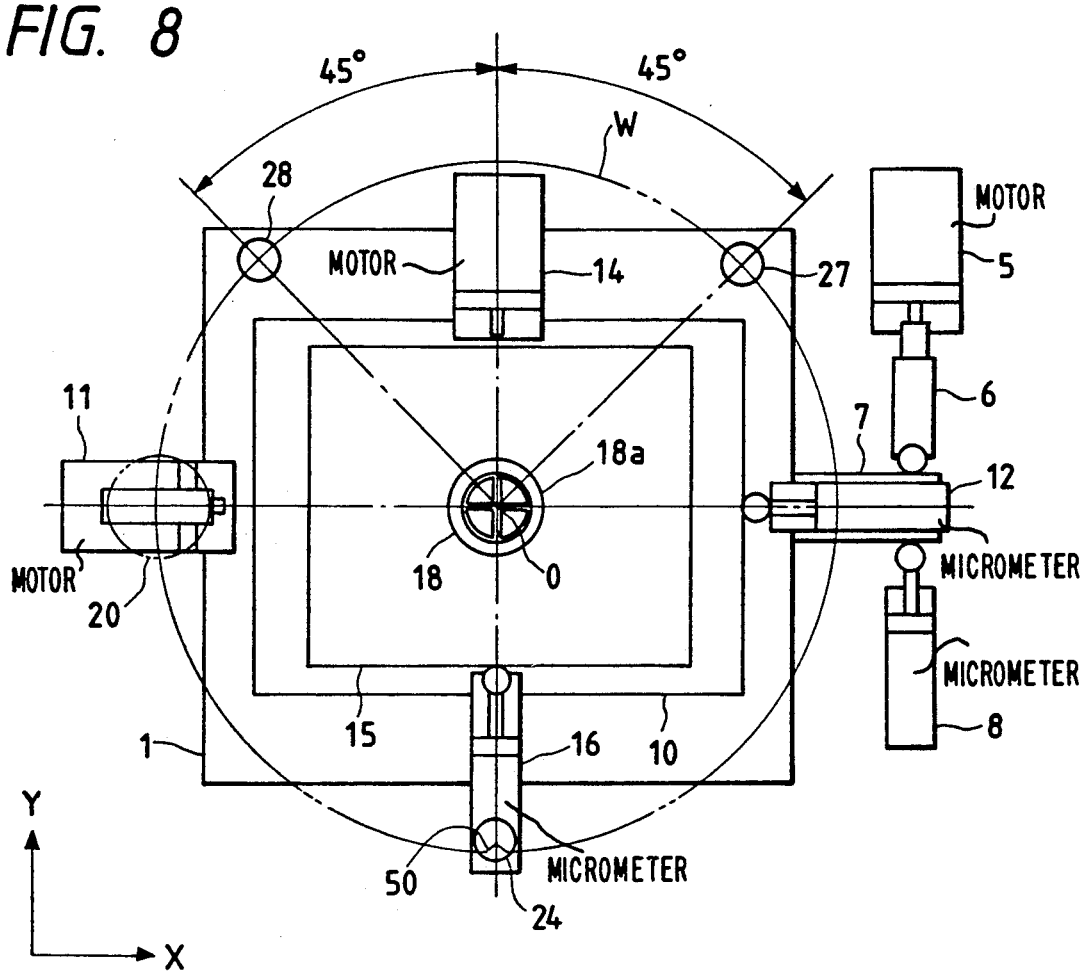
FIG. 8 is a plan view which illustrates the schematic structure of a second embodiment of a device for positioning a circular substrate according to the present invention.

A second embodiment of the present invention will now be described with reference to FIG. 8. FIG. 8 is a plan view which schematically illustrates the structure of a second embodiment of the positioning device according to the present invention. According to this embodiment, a positioning device capable of preferably positioning a wafer having a notch will be described. The elements having the same function or operation as those according to the first embodiment are given the same reference numerals. As shown in FIG. 8, this embodiment is different from the first embodiment in only the positions of the spot sensors 24, 27 and 28.

As shown in FIG. 8, the spot sensor 24 is disposed on the Y-axis, while the spot sensors 27 and 28 are disposed symmetrically with each other with respect to the Y-axis while being positioned in the XY coordinate system at a predetermined angle (referring to the drawing, 45°). The three spot sensors may be arranged in such a manner that they are divided into one spot sensor and two spot sensors with respect to the X-axis (or Y-axis) and the two spot sensors are disposed to confront each other (it is not necessary for them to be disposed symmetrically with each other) with respect to the Y-axis (or X-axis). Thus, the notch is moved to the range of the one spot sensor (it is not necessary for it to be disposed on the X or Y-axis) at the schematic notch alignment.

The positioning operation performed by the device according to this embodiment will now be described with reference to FIG. 9. FIG. 9 illustrates a sequence of positioning the wafer having a notch. Since the operations shown in FIGS. 9A to 9D are the same as those according to the first embodiment (see FIGS. 4A to 4D), their descriptions will be simple.

The wafer W is sent from the fork 30 to the turn table 18 (see FIG. 9A) before it is subjected to the schematic notch alignment performed by means of the analog sensor 20. As a result, the notch 50 is, as shown in FIG. 9B, moved to the position of the spot sensor 24 while restricting its rotational deviation with respect to the Y-axis to be, for example, about ±1°. The main control system 36 simultaneously operates the X and Y-stages 10 and 15 so as to slightly move the wafer W in a direction of a segment connecting the spot sensor 28 and the origin O (a direction making an angle of about 45° from the rectangular coordinate system XY). The second signal processing system 33 calculates the two-dimensional position of the wafer edge by processing the waveform of the photoelectric signal transmitted from the spot sensor 28. The main control system 36 sets the wafer W to the above-described coordinate value by using the X, Y-digital micrometers 12 and 16, that is, moves the wafer edge to the position of the spot sensor 28 (see FIG. 9C). Similarly, the main control system 36 moves the wafer edge to the position of the spot sensor 27 (see FIG. 9D).

As a result, the wafer center Wc and the origin O (the rotational center of the $\Delta\theta$ stage 1) are made substantially to coincide with each other, causing the deviation quantities $\Delta X$ and $\Delta Y$ to be restricted to be substantially zero. Thus, the X and Y-directional positioning operations are completed.

Figure 10:
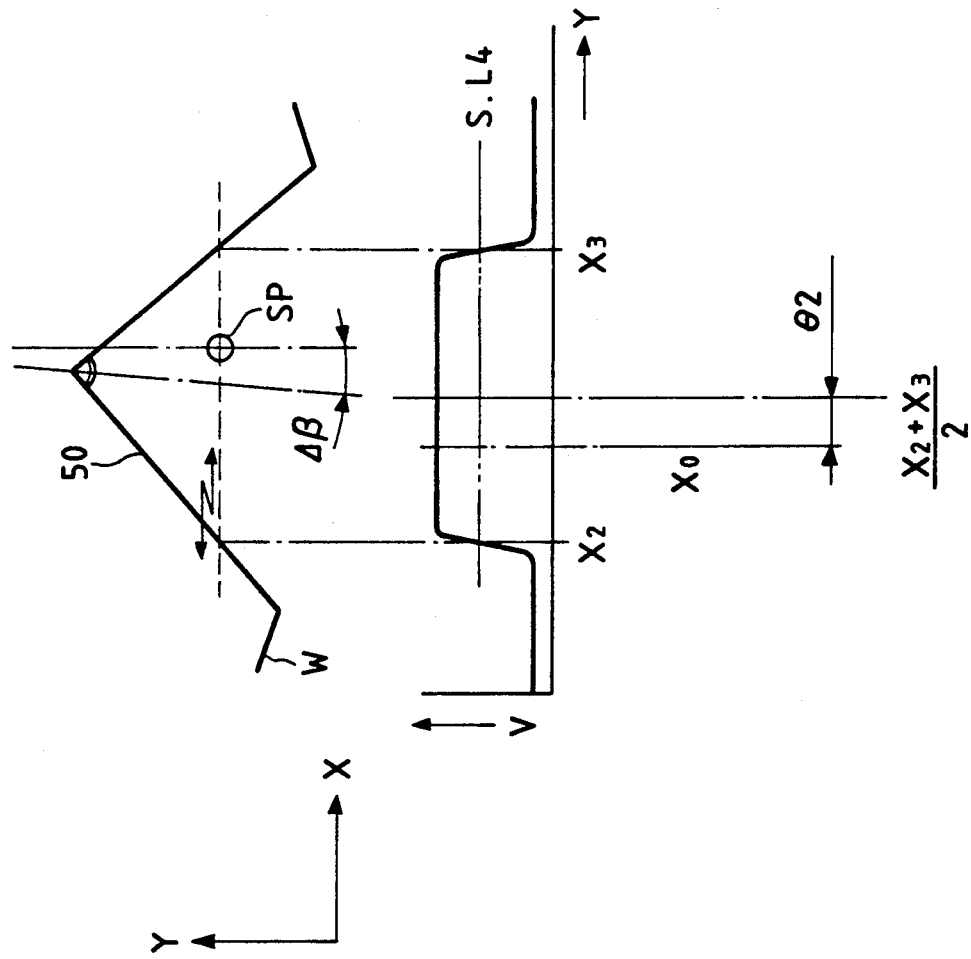
FIG. 10 illustrates the operation of measuring a residual rotational error of the wafer having the notch.

Then, the main control system 36 slightly moves the X-stage 10 so as to perform the precise notch alignment (see FIG. 9E). As a result, the notch 50 and the small spot light SP of the spot sensor 24 are relatively moved (see FIG. 10). Consequently, the spot sensor 24 transmits the photoelectric signal as shown in FIG. 10. The second signal processing system 33 processes the waveform of the above-described photoelectric signal with slice level $SL_4$ so as to detect the edge (coordinate values $X_2$ and $X_3$). Referring to FIG. 10, coordinate value $X_0$ is a position (substantially on the Y-axis) at which the X-stage 10 is stopped when the X and Y-directional positioning operations are completed. The main control system 36 calculates the inclination of the notch 50 with respect to the Y-axis from the above-described coordinate values $X_2$ and $X_3$, that is, residual rotation error $\Delta\beta$ (see FIG. 10) of the wafer W with respect to the rectangular coordinate system XY from following Equation (1):

$$\Delta\beta = \tan^{-1}\left(\frac{X_0 - (X_1 + X_2)/2}{Wr}\right) \quad (1)$$

where Wr denotes the radius of the wafer W.

Subsequently, the main control system 36 swings the $\Delta\theta$ stage 1 so as to perform the precise notch alignment in which the above-described residual rotation error $\Delta\beta$ is made to be substantially zero. As a result, the positional deviations $\Delta X$ and $\Delta Y$ of the wafer center Wc with respect to the origin O of the rectangular coordinate system XY and the residual rotation error $\Delta\beta$ are made to be substantially zero. Thus, the positioning the wafer W is completed. Also according to this embodiment, the deviation of the wafer center Wc from the origin O can be prevented at the time of the precise notch alignment.

As described above, according to this embodiment, the X-stage 10 is slightly moved at the time of the precise notch alignment. Although sufficient accuracy can be obtained by using the X-stage 10, it is preferable that the $\Delta\theta$ stage 1 is swung in a case where the established accuracy in the schematic notch alignment is insufficient or a further accurate precise notch alignment is required. At this time, it is necessary for the $\Delta\theta$ motor 5 to be stopped when the $\Delta\theta$ digital micrometer 8 detects a value which corresponds to $(\theta_2+\theta_3)/2$ when an assumption is made that the right and left edge positions (the rotational angle of the $\Delta\theta$ stage 1) of the notch 50 detected by the second signal processing system 33 are $\theta_2$ and $\theta_3$, respectively.

Figure 11:
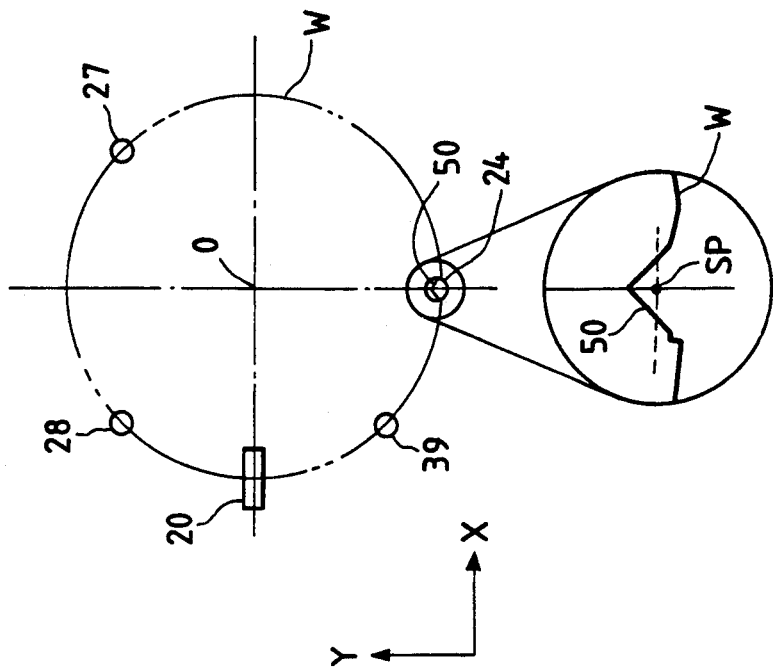
FIG. 11 illustrates a modification to the operation according to the second embodiment of the present invention.

Furthermore, as shown in FIG. 11, when a spot sensor 39 is disposed substantially symmetrically to the spot sensor 28 with respect to the X-axis so as to obtain the actual diameter of the wafer by using the spot sensors 27, 28 and 39 and again slightly move the X, Y-stages 10 and 15, the actual wafer center and the origin O can be made accurately to coincide with each other.

When the X and Y directional positioning operations are completed (see FIG. 9D), the actual diameter of the wafer W is measured by the spot sensors 27, 28 and 39. An offset in the direction Y is given to the wafer W in accordance with the diameter thus measured, the offset being given in such a manner that the spot sensor 24 (the spot light SP) is positioned at the substantially central portion of the notch in the direction Y. Then, the precise notch alignment is performed. As a result of the thus constituted sequence, a predetermined position of the notch, for example, the position at the substantially central portion at which the generation of the lack and sag can be prevented, can be detected. Consequently, the accuracy deterioration taking place at the time of detecting the residual rotation error $\Delta\beta$ due to the lack and sag can be prevented.

When the wafer edge is placed to the position of the spot sensor 27 (see FIG. 9D) or the precise OF alignment (see FIG. 9E) is performed, it is preferable that the deviation of the wafer edge from the spot sensors 27 and 28 is prevented by servo-controlling the X and Y-stages 10 and 15 in response to the photoelectric signals transmitted from the spot sensors 27 and 28 similarly to the above-described first embodiment. As an alternative to accurately obtaining the position of the wafer edge according to the above-described embodiment, another structure may be employed in which the wafer edge is moved to the positions of the spot sensors 27 and 28 by slightly moving the X and Y-stages 10 and 15 while monitoring the photoelectric signals transmitted from the spot sensors similarly to the first embodiment, the X and Y-stages 10 and 15 being slightly moved in such a manner that the level of each of the signals becomes a predetermined voltage level. According to this embodiment, in which the wafer having the notch is positioned, the precise OF alignment cannot be performed as shown in FIG. 10 if the wafer edge is moved to the position of the spot sensor 24. Therefore, it is, of course, necessary for the precise OF alignment to be performed by slightly moving the X-stage 10 or the Δθ stage 1.

Figure 12:
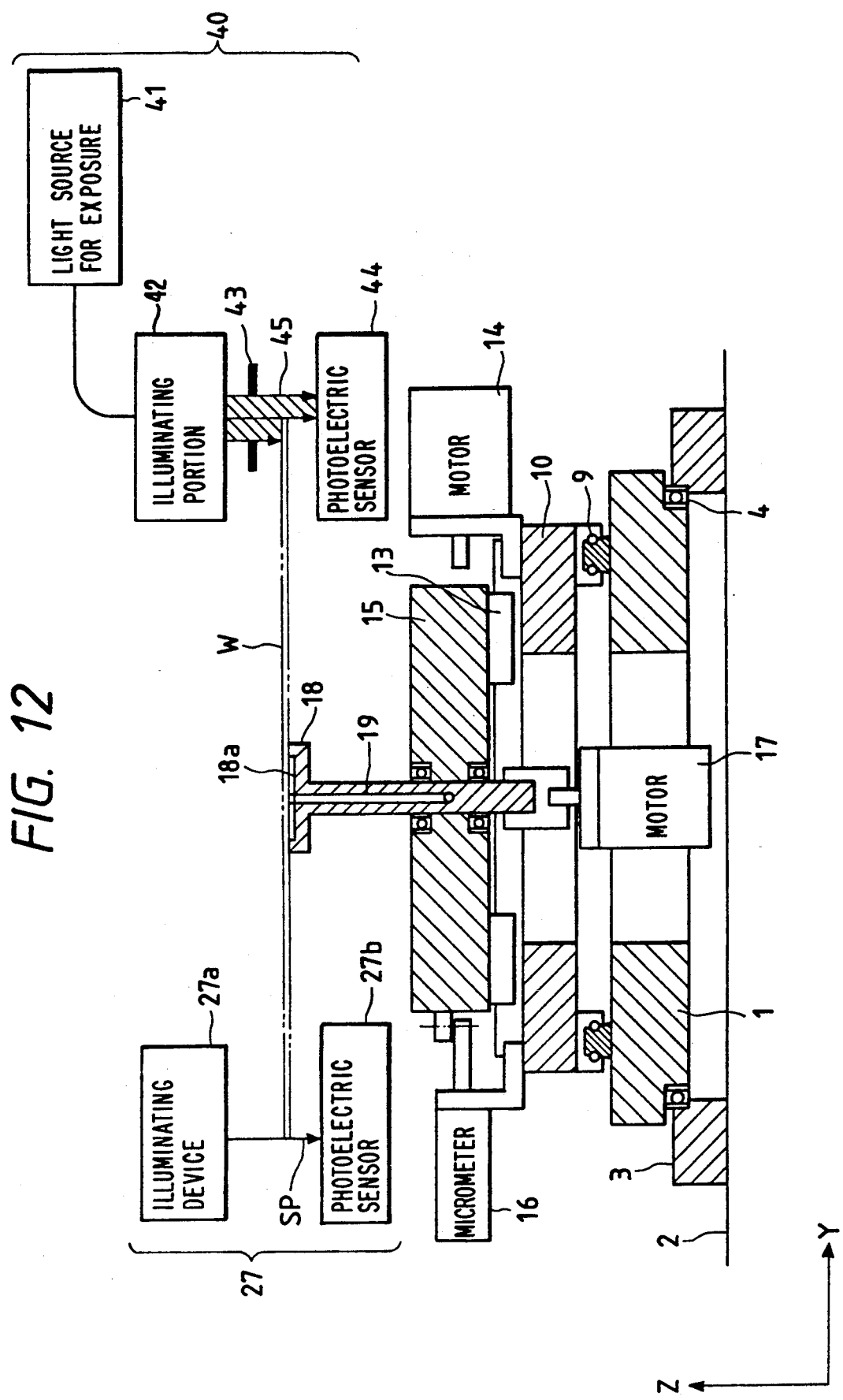
FIG. 12 is a plan view which illustrates the schematic structure of a third embodiment of a device for positioning a circular substrate according to the present invention.

A third embodiment of the present invention will now be described with reference to FIG. 12. FIG. 12 is a cross sectional view (a cross sectional view taken along line B—B of FIG. 1) which illustrates the schematic structure of the positioning device according to this embodiment. According to this embodiment, a positioning device having a periphery exposing function will be described. According to this embodiment, the device (FIG. 1) according to the first embodiment is further arranged in such a manner that a periphery exposing portion 40 is disposed on the Y-axis to confront the spot sensors 27 and 28. Therefore, the description is hereinafter limited to the structure of the periphery exposing portion 40. The elements having the same function and operation as those of the device according to the first embodiment (see FIG. 2) are given the same reference numerals.

Referring to FIG. 12, an illuminating portion 42 disposed above the wafer periphery portion has a light source 41 for exposure. The exposing light source 41 emits an exposing beam (an extreme ultraviolet radiation) having the wavelength which is able to sensitize the resist layer. It is not necessary for the exposing light source 41 to be disposed adjacent to the illuminating portion 42 but it may be disposed in a relatively large space in the stepper in such a manner that it is connected to the illuminating portion 42 by means of an optical fiber. A diaphragm (for example, a light shielding plate having a rectangular aperture or sectorial aperture) 43 is disposed between the illuminating portion 42 and the wafer W, the diaphragm 43 causing an exposing beam 45 emitted from the illuminating portion 42 to form a predetermined shape on the wafer W. A photoelectric sensor 44 is disposed to confront the illuminating portion 42 via the periphery portion of the wafer W so as to detect the wafer edge by receiving the exposing beam 45 which has not been stopped by the wafer W.

In order to prevent the reduction of the thickness of the resist layer, it is preferable that the numerical aperture (N.A.) of the exposing beam 45 be reduced by disposing a lens system in the illuminating portion 42 or between the illuminating portion 42 and the wafer W. In a case where an optical system (for example, a Koehler illuminating system in which the light emitting end of the optical fiber is disposed on the pupil surface (diaphragm surface) of the optical system) which equalizes the light intensity distribution is disposed in the illuminating portion 42, the periphery exposure can be performed in a proper condition.

When the periphery exposure is performed, data about the proper quantity of exposure for the resist stored in the stepper body (or the memory 34) is supplied to the main control system 36 so as to be used to determine the exposing condition (exposure light intensity or the like) and the rotational speed of the turn table 18 in order to prevent degeneration of the resist due to the extreme ultraviolet radiation.

If the exposing light intensity is weakened so as to prevent the foaming of the resist, the rotational speed must be lowered in order to obtain the proper quantity of exposure and the throughput in the exposing process is thereby lowered. Therefore, a structure may be employed in which the intensity of exposing light at the first rotation is restricted to be smaller than the quantity of exposing light which will generate the foam and the turn table 18 is rotated two times or more when one wafer is subjected to the periphery exposure.

The main control system 36 relatively moves the exposing beam 45 and the wafer W in its radial direction in accordance with data, which has been received by the memory 34 (see FIG. 3), about a necessary exposure region (the distance from the edge) and a wafer edge detection signal transmitted from the light receiving portion 44. According to this embodiment, an operating signal for slightly moving the Y-stage 15 is transmitted to the stage controller 35 while fixing the exposing beam 45. Then, when the turn table 18 is rotated at a predetermined speed for the purpose of commencing the exposing operation, the position of the exposing beam 45 with respect to the wafer edge is servo-controlled by slightly moving the Y-stage 15 in response to the above-described operating signal so as to cause the region from the wafer edge by a distance in its radial direction to be exposed to the exposing beam 45 emitted from the illuminating portion 42.

The operation of the device according to this embodiment will now be described with reference to FIG. 13. FIG. 13 illustrates a sequence for exposing the periphery of the wafer having the OF. Since the positioning operation is described in the description about the first embodiment, it is omitted here.

Figure 13A:
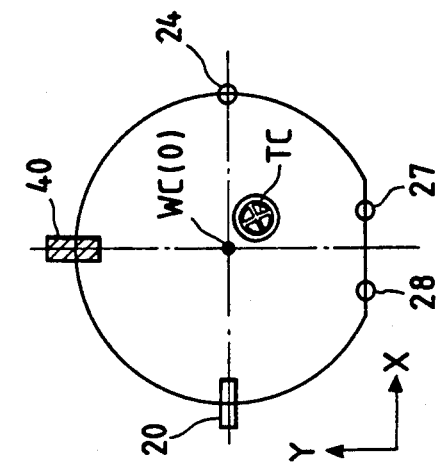
Figure 13B:
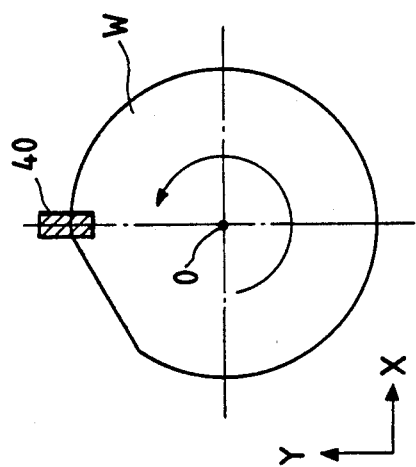
Figure 13C:
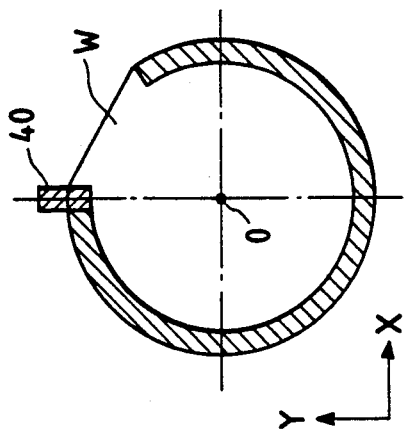

The wafer W is accurately positioned with respect to the rectangular coordinate system XY (see FIG. 13A). As shown in FIG. 13B, the main control system 36 rotates the turn table 18 by a predetermined angular degree in such a manner that the exposing light beam 45 is applied to the necessary exposure region in the vicinity of the boundary between the OF and the circumferential portion, so that the exposure of the circumferential portion is commenced. Then, a shutter (omitted from illustration) disposed between the light source 41 and the illuminating portion 42 is opened so that the illuminating of the periphery with the exposing light beam 45 is started. Furthermore, the turn table 18 is rotated at a rotational speed which corresponds to the proper quantity of exposure. At this time, the main control system 36 servo-controls the Y-stage 15 in accordance with data about the necessary region to be exposed to light and in response to the wafer edge detection signal transmitted from the light receiving portion 44, the servo-control being performed in such a manner that the positional relationship (the width to be exposed) between the exposing light beam 45 and the wafer edge is made to be always constant. As a result, the periphery of the circumferential portion is exposed to light by a proper quantity of exposure and with an accurate width to be exposed (see FIG. 13C).

Then, the main control system 36 issues a command to stop the θ-motor 17 to the stage controller 35 when it detects the OF in accordance with the change in the wafer edge detection signal transmitted from the light receiving portion 44. As a result, the OF coincides with the direction X, causing the rotation of the turn table 18 to be stopped (see FIG. 13D). A structure may be employed in which the wafer edge detection signal is not used but the θ-motor 17 is stopped when the turn table 18 has been rotated by a predetermined angular degree in accordance with various data items. Furthermore, the wafer W is linearly moved in the direction X by moving the X-stage 10 so that the periphery of the OF is exposed to light. As a result, the periphery portion can be exposed to light at the same accuracy as the circumferential portion with an accurate exposure width even if the dimension of the wafer is not uniform or the subject portion is the OF portion (see FIG. 13E).

Figure 13D:
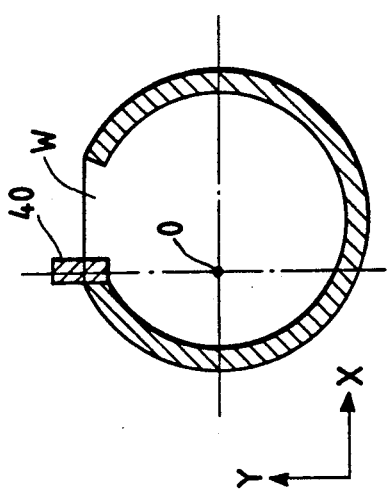
Figure 13E:
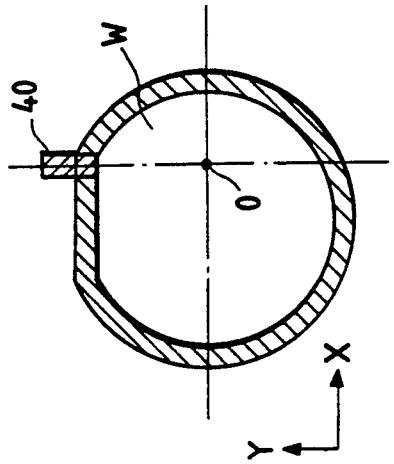

In this state, if the stopping accuracy of the turn table 18 and the detecting resolution of the encoder 31 are considered, the turn table 18 will be stopped while inclining the OF with respect to the direction X when viewed in FIG. 13D. Accordingly, it is preferable that the servo-control be performed with an exposure width by slightly moving the Y-stage 15 when the periphery exposure of the OF is performed as shown in FIG. 13E. In order to perform the above-described servo-control, two slit-shaped position sensors are in parallel formed in the light receiving portion 44 so as to use the wafer edge detection signals transmitted from the two sensors. When the Y-stage 15 is slightly moved in such a manner that the outputs (voltage levels) from the two sensors or the difference in the two outputs are always constant, the exposure width can be accurately controlled. Furthermore, when the OF is detected as shown in FIG. 13D, the OF is able to satisfactorily follow the rotation of the turn table. Consequently, the OF can be further accurately detected.

Figure 14A:
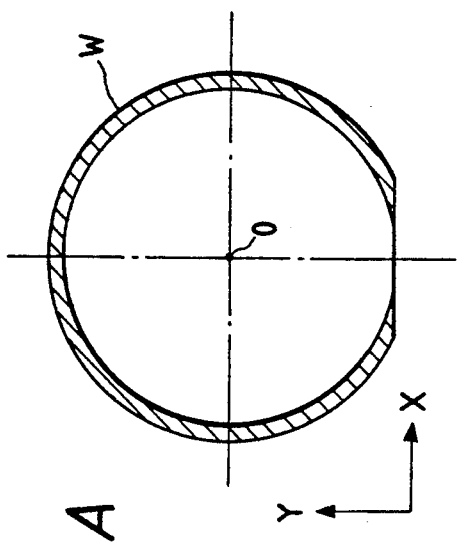
FIGS. 14A and 14B respectively illustrate modifications to the operation according to the third embodiment of the present invention.
Figure 14B:
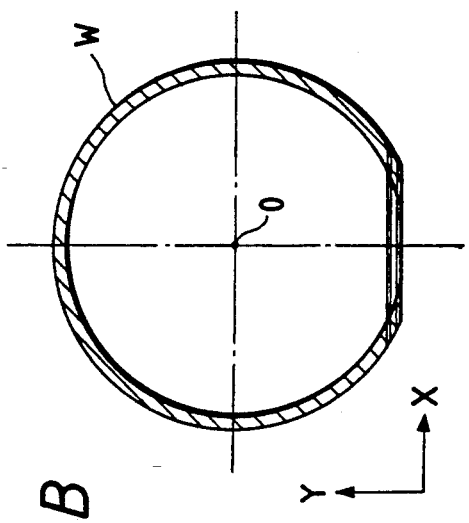
Figure 16:
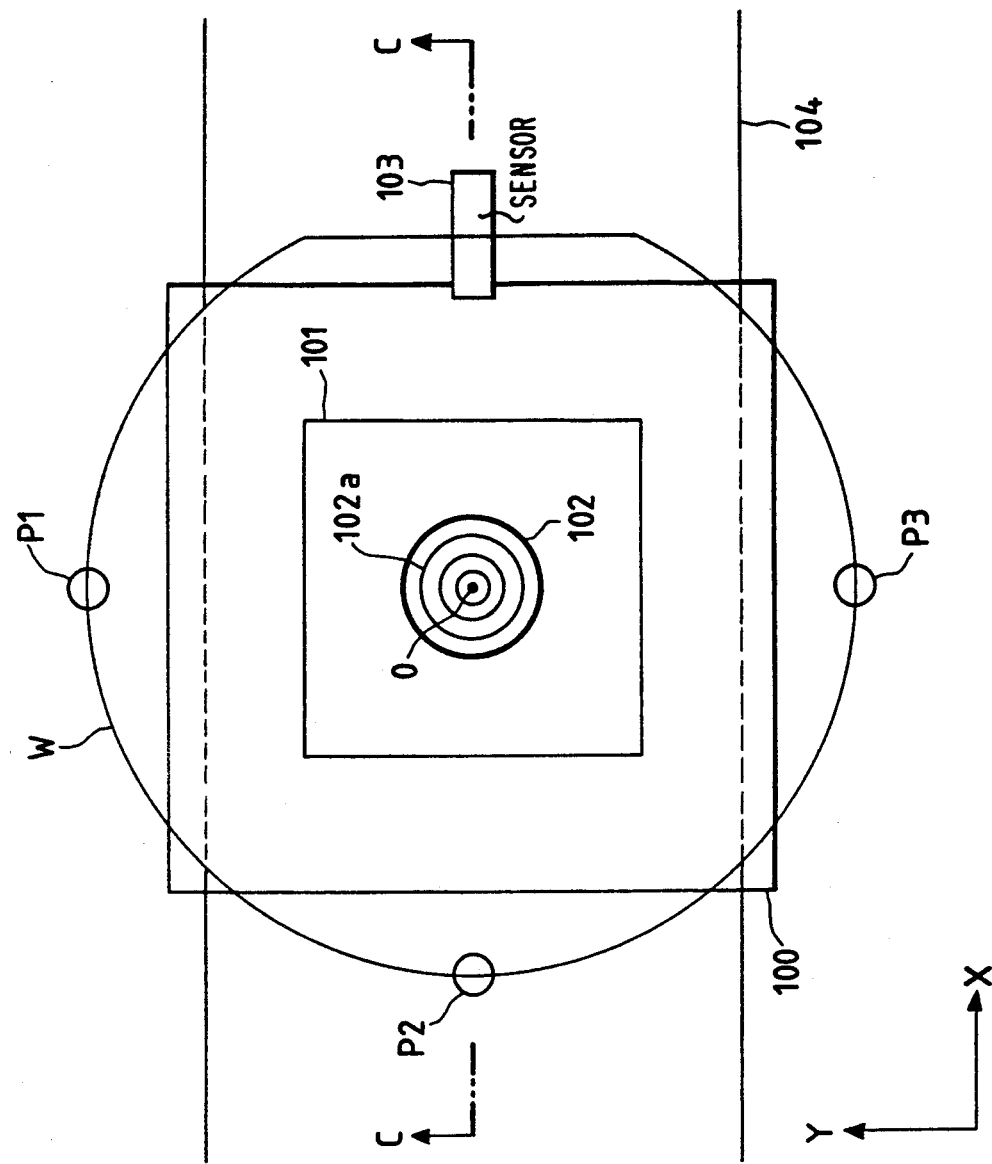
FIG. 16 is a schematic view which illustrates the schematic structure of a conventional positioning device.
Figure 17:
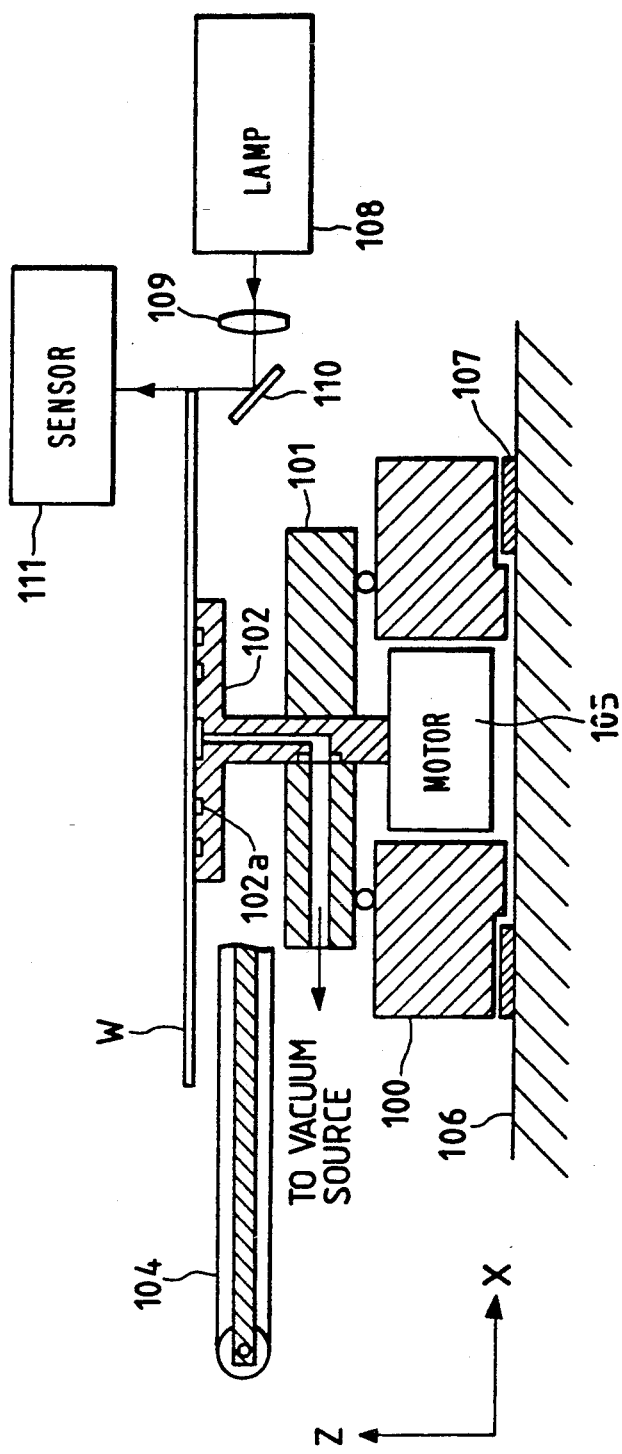
FIG. 17 is a cross sectional view taken along line C—C of FIG. 16.

As described above, according to this embodiment, the periphery exposure is commenced after the wafer edge is positioned with respect to the exposing light beam 45 (see FIG. 13B). However, the periphery exposure may be started from the state shown in FIG. 13A. In this case, the turn table 18 is first rotated once so that a portion of the circumferential portion of a predetermined width is exposed to light (FIG. 14A). At this time, the main control system 36 determines whether or not the OF is present in accordance with the change in the wafer edge detection signal. If the OF is detected, the servo control is stopped so as to prevent the exposure operation. Then, the X-stage 10 is linearly moved in accordance with various data items obtained in the above-described positioning operation, such as information about the position of the wafer center, position and the length of the OF, so that the OF is exposed to light (FIG. 14B).

According to this system, the boundary portions (double hatched section of FIG. 14B) between the circumferential portion and OF portion are subjected to the double exposure. However, since the resist is accumulated in the above-described hatched section by the resist applying device (spinner), no problem arises if the quantity of exposing light is enlarged in comparison to the other portions.

According to the above-described embodiment, the wafer center Wc is deviated from the rotational center Tc of the turn table 18 by a quantity smaller than the initially set quantity (±5 mm) of deviation. Therefore, the wafer W is rotated eccentrically when the turn table 18 is rotated, causing the quantity of movement of the Y-stage at the time of the servo control to be enlarged. The coordinate values of the X and Y-stages 10 and 15, when they are at neutral positions (see FIG. 4A) and those when the wafer center Wc and the origin O coincide with each other (see FIG. 4E) after the X and Y-directional positioning operations have been ended, are read through the X and Y-digital micrometers 12 and 16 As a result, the quantity of the deviation between the rotational center Tc of the turn table 18 and the wafer center Wc can be calculated.

Therefore, the wafer W is shifted from the turn table 18 to the fork 30 prior to performing the periphery exposure, and the X and Y stages 10 and 15 are moved so as to make the above-described quantity of deviation to be substantially zero. Then, the wafer W is again sent to the turn table 18. As a result, the rotational center Tc of the turn table 18 and the wafer center Wc (the origin O) substantially coincide with each other, causing the quantity of the eccentricity of the wafer to be substantially zero when the turn table 18 is rotated. As a result, the quantity of the movement of the Y-stage 15 can be reduced when the servo control is performed. The quantity of the eccentricity is determined by only the mechanical receiving accuracy between the fork 30 and the turn table 18. It can be restricted to be, for example, 10 μm or less.

When the accurate diameter of the wafer, that is, the actual wafer center is obtained by using the spot sensors 37 and 38 (see FIG. 7) for measuring the diameter according to the first embodiment, the actual wafer center can be made accurately to coincide with the rotational center Tc of the turn table 18. Furthermore, when the Y-stage 15 (preferably also the X-stage 10) is operated in accordance with the rotation of the turn table 18 (while monitoring the output value of the encoder 31) depending upon the various data items obtained in the positioning operation after the actual wafer center has been made accurately to coincide with the rotational center Tc of the turn table 18, the exposure width can be accurately controlled by an opening control operation.

If the wafer W is not shifted to the turn table 18, the peripheral exposure can, of course, be performed in the opening control operation in accordance with the actual position of the wafer center or the various data items. Furthermore, it is apparent that the periphery exposure can be similarly performed by the opening control operation in a conventional case where the optical fiber in the illuminating portion is moved in the radial direction.

When the Δθ stage 1 is then rotated, the X and Y-stages 10 and 15 disposed on the Δθ stage 1 are not moved along the X and Y-axes but a moving coordinate system is rotated with respect to the rectangular coordinate system XY. Therefore, it is preferable when the periphery exposure is performed that the stage position be sequentially corrected in accordance with the above-described quantity of rotation or the quantity of movement of the stage be corrected in a software manner while storing the above-described quantity of rotation in a memory.

It is preferable that re-positioning and, in particular, a precise OF alignment be performed prior to conveying in the stepper after the periphery exposure has been completed. The reason for this is that, although the wafer center Wc and the origin O can be made satisfactorily accurately to coincide with each other by again moving the X and Y-stages 10 and 11 to the coordinate values when the positioning has been ended because the digital micrometers 12 and 16 have excellent resolution and reproducibility, satisfactory positioning accuracy cannot be obtained according to this embodiment because the encoder 31 and the θ-motor 17 suffer from unsatisfactory accuracy.

According to this embodiment, the operation for exposing the wafer having the OF has been described. A wafer having a notch may be exposed in such a manner that its overall periphery is exposed to light similarly to the operation for exposing the circumferential portion to be performed according to the above-described embodiment.

Furthermore, a sequence may be arranged in such a manner that the wafer W is again introduced into the above-described device after the pattern exposure has been completed by means of the stepper, so that its periphery is exposed to light.

Furthermore, a structure may be employed in which the irradiating light beam emitted from the analog sensor 20 and the exposing light beam emitted from the periphery exposing portion 40 can be switched over by means of, for example, a dichroic mirror so that the light optical system (made achromatic by two wavelengths) except for the light source is commonly possessed. As a result, the analog sensor 20 and the periphery exposing portion 40 can be integrally constituted.

Furthermore, the analog sensor 20 may have the edge detecting function for the periphery exposure operation by making the irradiating light beam emitted from the analog sensor 20 to be the optical beam having the exposing wavelength.

Figure 15:
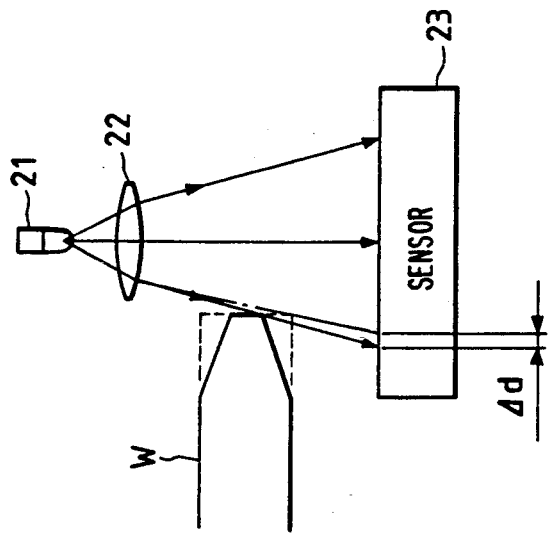
FIG. 15 illustrates the specific structure of a spot sensor.

According to the above-described first, second and third embodiments, the small spot light (parallel beam) is used in the spot sensors 24, 27, 28, 37 and 38. The reason for this is that the edge position will be detected, as shown in FIG. 15, while being deviated by Δd depending upon whether or not the wafer edge is chamfered, if the small parallel beams are not used in the spot sensors. Furthermore, the parallel beam of small area is employed in order to reduce the irregular light quantity (irregular irradiation) and in consideration of the linearity of the photoelectric sensor.

Although the invention has been described in its preferred form with a certain degree of particularly, it is understood that the present disclosure of the preferred form may be changed in the details of construction and the combination and re-arrangement of parts may be resorted to without departing from the spirit and the scope of the invention as hereinafter claimed.

What is claimed is:

1. A device for positioning a circular substrate having a cut portion with respect to a rectangular coordinate system; comprising:
   a first rotational stage capable of rotating substantially around the coordinate origin of said rectangular coordinate system;
   an X-Y stage disposed on said first rotational stage and capable of two-dimensionally moving in said rectangular coordinate system;
   a second rotational stage disposed on said X-Y stage and capable of rotating while holding said circular substrate;
   a first detecting device for detecting information about a change in the quantity of displacement of the periphery of said circular substrate from the rotational center during the rotation of said second rotational stage;
   first positioning controlling means for controlling the rotation of said second rotational stage in accordance with information detected by said first detecting device in such a manner that said cut portion of said circular substrate is placed in a predetermined direction on said rectangular coordinate system;
   a second detecting device having at least three predetermined detecting points in said rectangular coordinate system so as to be capable of detecting at least three positions of said periphery of said circular substrate, said second detecting device generating information about a detection at each of said at least three detecting points; and
   second positioning controlling means for controlling said X-Y stage and said first rotational stage in accordance with said detection information supplied from said second detecting device after said cut portion has been placed in said predetermined direction by said first positioning controlling means.

2. A device for positioning a circular substrate according to claim 1, wherein said X-Y stage is disposed so as to be capable of two-dimensionally moving with respect to said first rotational stage and said second rotational stage is disposed so as to be capable of rotating with respect to said X-Y stage.

3. A device for positioning a circular substrate according to claim 1, wherein said second positioning controlling means controls said X-Y stage and said first rotational stage in such a manner that the central portion of said circular substrate is positioned while always maintaining a substantially constant positional relationship with respect to said coordinate origin and so that a residual rotation error of said circular substrate with respect to said rectangular coordinate system is made to be substantially zero.

4. A device for positioning a circular substrate according to claim 1, wherein the rotational center of said second rotational stage is disposed to substantially coincide with said coordinate origin when said X-Y stage has been positioned at a neutral position.

5. A device for positioning a circular substrate according to claim 1, wherein said second positioning controlling means includes:
   a calculator for calculating a residual rotation error in accordance with detection information supplied from said second detecting device; and
   a controller for controlling said X-Y stage in accordance with detection information supplied from said second detecting device and for controlling said first rotational stage in accordance with said residual rotation error calculated by said calculator.

6. A device for positioning a circular substrate according to claim 5, wherein said controller moves said first rotational stage so as to make said residual rotation error to be substantially zero after said controller makes the central portion of said circular substrate and said coordinate origin coincide with each other by slightly moving said X-Y stage.

7. A device for positioning a circular substrate according to claim 6, wherein said controller includes a servo controller for servo-controlling said X-Y stage in accordance with detection information supplied from said second detecting device, said servo controller moving said X-Y stage in a second direction which traverses a first direction while servo-controlling said X-Y stage in said first direction so that the central portion of said circular substrate is made substantially to coincide with said coordinate origin.

8. A device for positioning a circular substrate according to claim 6, wherein said controller includes a servo controller for servo-controlling said X-Y stage in accordance with detection information supplied from said second detecting device, said servo controller moving said first rotational stage while servo-controlling said X-Y stage so that said residual rotation error is made to be substantially zero.

9. A device for positioning a circular substrate according to claim 6, wherein said calculator calculates said residual rotation error and the diameter of said circular substrate in accordance with detection information supplied from said second detecting device and said controller moves said X-Y stage in accordance with information about thus calculated diameter and said detection information so as to make said central portion of said circular substrate and said coordinate origin substantially coincide with each other before said controller moves said first rotational stage so as to make said residual rotation error to be substantially zero.

10. A device for positioning a circular substrate according to claim 1, wherein said second detecting device includes:
   an illuminating device for emitting an illuminating light beam of wavelength range to which a resist layer of said circular substrate is non-sensitive; and
   a light receiving device disposed to substantially confront said illuminating device via the periphery of said circular substrate, said illuminating device emitting a parallel beam to form a spot in said periphery of said circular substrate.

11. A device for positioning a circular substrate according to claim 1 further comprising:
   exposing means including an illuminating portion for emitting an exposing light beam having characteristics to which a resist layer of said circular substrate is sensitive and a light receiving portion disposed to substantially confront said illuminating portion via the periphery of said circular substrate; and
   exposure controlling means for determining at least either an exposing condition by means of said exposing light beam or the rotational speed of said circular substrate rotated by said second rotational stage in accordance with information about a proper quantity of exposure for said resist layer.

12. A device for positioning a circular substrate according to claim 11, wherein said exposure controlling means selectively exposes said resist layer in the periphery of said circular substrate while controlling said X-Y stage in such a manner that said exposing light beam is applied to a predetermined range in a radial direction of said periphery portion of said circular substrate after said central portion of said circular substrate and said coordinate origin have been made substantially to coincide with each other by said second positioning controlling means.

13. A device for positioning a circular substrate according to claim 11, wherein said exposing means generates information about the change in the intensity of said exposing light beam to be made incident upon said light receiving portion during the rotation of said second rotational stage and said exposure controlling means selectively exposes said resist layer in the periphery of said circular substrate while controlling said X-Y stage in accordance with information generated by said exposing means in such a manner that said exposing light beam is applied to a predetermined range in a radial direction of said periphery portion of said circular substrate.

14. A device for positioning a circular substrate having an orientation flat on the periphery thereof with respect to a rectangular coordinate system; comprising:
   a first rotational stage capable of rotating substantially around the coordinate origin of said rectangular coordinate system;
   an X-Y stage disposed on said first rotational stage and capable of two-dimensionally moving in said rectangular coordinate system;
   a second rotational stage disposed on said X-Y stage and capable of rotating while holding said circular substrate;
   a first detecting device for detecting information about a change in the quantity of displacement of the periphery of said circular substrate from the rotational center during the rotation of said second rotational stage;
   first positioning controlling means for controlling the rotation of said second rotational stage in accordance with information detected by said first detecting device in such a manner that said orientation flat is placed in a predetermined direction on said rectangular coordinate system;
   a second detecting device having at least three predetermined detecting points in said rectangular coordinate system so as to be capable of detecting at least two positions of said orientation flat and at least one position of said periphery of said circular substrate except for said orientation flat when said orientation flat has been placed in said predetermined direction by said first positioning controlling means, said second detecting device generating information about a detection at each of said at least three detecting points;
   a calculator for calculating a residual rotation error of said circular substrate with respect to said rectangular coordinate system in accordance with detection information at said two or more positions which correspond to said orientation flat of said second detecting device; and
   second positioning controlling means for controlling said X-Y stage in accordance with said detection information about said at least three detecting positions supplied from said second detecting device and controlling said first rotational stage in accordance with said residual rotation error calculated by said calculator after said orientation flat has been placed in said predetermined direction by said first positioning controlling means.

15. A device for positioning a circular substrate having a notch on the periphery thereof with respect to a rectangular coordinate system, comprising:
   a first rotational stage capable of rotating substantially around the coordinate origin of said rectangular coordinate system;
   an X-Y stage disposed on said first rotational stage and capable of two-dimensionally moving in said rectangular coordinate system;
   a second rotational stage disposed on said X-Y stage and capable of rotating while holding said circular substrate;
   a first detecting device for detecting information about a change in the quantity of displacement of the periphery of said circular substrate from the rotational center during the rotation of said second rotational stage;
   first positioning controlling means for controlling the rotation of said second rotational stage in accordance with information detected by said first detecting device in such a manner that said notch is placed in a predetermined direction on said rectangular coordinate system;
   a second detecting device having at least three predetermined detecting points in said rectangular coordinate system so as to be capable of detecting at least the position of each of edges forming said notch and at least two positions of said periphery of said circular substrate except for said notch when said notch has been placed in said predetermined direction by said first positioning controlling means;

a calculator for calculating a residual rotation error of said circular substrate with respect to said rectangular coordinate system in accordance with detection information about at least one edge position of said notch of said second detecting device; and second positioning controlling means for controlling said X-Y stage in accordance with said detection information supplied from said second detecting device about said at least two detecting positions corresponding to said periphery of said circular substrate except for said notch and controlling said first rotational stage in accordance with said residual rotation error calculated by said calculator after said notch has been placed in said predetermined direction by said first positioning controlling means.

16. A device for positioning a circular substrate having a cut portion on the periphery thereof with respect to a rectangular coordinate system; comprising:

a first rotational stage capable of rotating substantially around the coordinate origin of said rectangular coordinate system;

an X-Y stage disposed on said first rotational stage and capable of two-dimensionally moving with respect to said first rotational stage in said rectangular coordinate system;

a second rotational stage disposed on said X-Y stage and capable of rotating with respect to said X-Y stage while holding said circular substrate; and positioning control means for controlling said X-Y stage and said first rotational stage in such a manner that the central portion of said circular substrate is positioned while always maintaining a substantially constant positional relationship with respect to said coordinate origin and so that a residual rotation error of said circular substrate with respect to said rectangular coordinate system is made to be Substantially zero.

* * * * *